(12) United States Patent
Tokura et al.

(10) Patent No.: US 7,616,859 B2
(45) Date of Patent: Nov. 10, 2009

(54) SEMICONDUCTOR DEVICE

(75) Inventors: Norihito Tokura, Okazaki (JP); Hiroki Sone, Nukata-gun (JP); Shinji Amano, Okazaki (JP); Hisato Kato, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/155,949

(22) Filed: Jun. 12, 2008

(65) Prior Publication Data
US 2009/0001411 A1    Jan. 1, 2009

(30) Foreign Application Priority Data
Jun. 14, 2007   (JP)   ............... 2007-157923
May 15, 2008   (JP)   ............... 2008-128775

(51) Int. Cl.
*G02B 6/00*   (2006.01)
(52) U.S. Cl. .................. 385/147; 257/107; 257/133; 257/139; 257/140; 257/341
(58) Field of Classification Search .......... 385/147; 257/107, 133, 139, 140, 341
See application file for complete search history.

(56) References Cited
U.S. PATENT DOCUMENTS

| | | | |
|---|---|---|---|
| 5,360,984 A | 11/1994 | Kirihata | |
| 6,399,998 B1 | 6/2002 | Chang | |
| 6,459,139 B2 * | 10/2002 | Watanabe et al. | ........... 257/551 |
| 6,639,295 B2 | 10/2003 | Majumdar et al. | |
| 6,737,705 B2 | 5/2004 | Momota et al. | |
| 6,809,349 B2 | 10/2004 | Yamaguchi et al. | |
| 7,078,740 B2 | 7/2006 | Yamaguchi et al. | |
| 7,112,868 B2 | 9/2006 | Willmeroth et al. | |
| 7,154,145 B2 | 12/2006 | Takahashi | |
| 7,170,106 B2 | 1/2007 | Yamaguchi et al. | |
| 7,319,257 B2 | 1/2008 | Yamaguchi et al. | |
| 2005/0274995 A1 * | 12/2005 | Park | ........... 257/291 |
| 2007/0069287 A1 | 3/2007 | Takahashi | |
| 2007/0108468 A1 | 5/2007 | Takahashi | |

FOREIGN PATENT DOCUMENTS

| | | |
|---|---|---|
| JP | A-5-57235 | 3/1993 |
| JP | A-2005-243936 | 9/2005 |
| JP | A-2006-173296 | 6/2006 |

* cited by examiner

*Primary Examiner*—Jennifer Doan
(74) *Attorney, Agent, or Firm*—Posz Law Group, PLC

(57) ABSTRACT

A semiconductor device includes a spaced-channel IGBT and an antiparallel diode that are formed in a same semiconductor substrate. The IGBT includes a base layer and insulated gate trenches by which the base layer is divided into a body region connected to an emitter and a floating region disconnected from the emitter. The IGBT is formed in a cell region of an IGBT region, and the diode is formed in a diode region. A boundary region of the IGBT region is located between the cell region and the diode region. A spacing between adjacent gate trenches in the boundary region is less than a spacing between adjacent gate trenches between which the floating region is located in the cell region.

17 Claims, 16 Drawing Sheets

US 7,616,859 B2

SEMICONDUCTOR DEVICE

CROSS REFERENCE TO RELATED APPLICATION

This application is based on and incorporates herein by reference Japanese Patent Applications No. 2007-157923 filed on Jun. 14, 2007 and No. 2008-128775 filed on May 15, 2008.

FIELD OF THE INVENTION

The present invention relates to a semiconductor device including a spaced-channel insulated-gate bipolar transistor and an antiparallel diode, both of which are formed in a same semiconductor substrate.

BACKGROUND OF THE INVENTION

As is well known, an inverter circuit converts a direct current (DC) voltage to an alternating current (AC) voltage and supplies the AC voltage to an inductive load (i.e., inductance L) such as an inductive motor. For example, this type of inverter circuit is constructed with a semiconductor device 100 shown in FIG. 23A. The semiconductor device 100 includes an insulated-gate bipolar transistor (IGBT) 100i and an antiparallel diode 100d that is connected in antiparallel with the IGBT 100i.

An inverter circuit for generating a three-phase AC voltage is constructed with six semiconductor devices 100. As shown in FIG. 23B, each phase is generated using two semiconductor devices 100 connected in series between a DC power source and a ground potential. The IGBT 100i serves as a switching element. The antiparallel diode 100d serves as a free wheel diode. A load current flowing through an inductance (not shown) coupled to an output can flow through the diode 100d, when the IGBT 100i is turned off. Thus, a sudden change in the load current can be prevented. Such a diode 100d is called a flee wheel diode (FWD).

The semiconductor device 100 can be implemented such that the IGBT 100i and the diode 100d are formed in separate semiconductor substrates (chips). However, to reduce size of the semiconductor device 100, it is preferable that the IGBT 100i and the diode 100d be formed in the same semiconductor substrate FIG. 24 illustrates a semiconductor device 91 disclosed in U.S. Pat. No. 7,154,145 corresponding to JP-A-2005-101514. In the semiconductor device 91, an IGBT and an antiparallel diode are formed in the same semiconductor substrate. Specifically, a p-type base layer (well) 2 is formed on a first side of an $N^-$-type semiconductor substrate 1 for each IGBT cell. An $N^+$-type cathode layer 4 and a $P^+$-type collector layer 5 are formed on a second side of the semiconductor substrate 1 and located just below the base layer 2. The p-type base layer 2 of each IGBT cell includes first and second side diffusion regions 2SDR1, 2SDR2 and a flat region 2FR located between the first and second side diffusion regions 2SDR1, 2SDR2. The flat region 2FR has an emitter region 3 and a bottom surface penetrated by an insulated gate trench 6. The first side diffusion region 2SDR1 is located just above the $N^+$-type cathode layer 4. The $N^+$-type cathode layer 4 is located adjacent to the $P^+$-type collector layer 5. A diode cell is constructed with the $N^-$-type semiconductor substrate 1, the p-type base layer 2, and the $N^+$-type cathode layer 4. An emitter electrode 10 of the IGBT cell is integrated with an anode electrode of the diode cell, and a collector electrode 11 of the IGBT cell is integrated with a cathode electrode of the diode cell. Thus, the diode cell is connected in antiparallel with the IGBT cell.

The IGBT cell in the semiconductor device 91 is a trench gate IGBT. In a trench gate IGBT, channels are formed at both sides of an insulated gate trench so that channel density can be increased. Therefore, a trench gate IGBT can have a low on-voltage compared to a planar gate IGBT.

FIG. 25 illustrates a trench gate IGBT 92 disclosed in U.S. Pat. No. 6,737,705 corresponding to JP-A-2001-308327. The IGBT 92 is designed to achieve, not only a low on-voltage, but also a low switching loss, thereby reducing total loss. As shown in FIG. 25, the IGBT 92 includes a silicon substrate 21, a lightly doped N-type drift layer 22, a P-type base layer 23, an $N^+$-type source region 24, a gate oxide film 25 arranged in a trench penetrating through the p-type base layer 23, a gate electrode 26 arranged in the trench through the gate oxide film 25, an interlayer insulation film 27, an emitter electrode 28 coupled to the $N^+$-type source region 24, and a collector electrode 29 coupled to an opposite surface of the silicon substrate 21. The p-type base layer 23 is divided by the trench into a body region 23a and a floating region 23b. The body region 23a is coupled to the emitter electrode 28 and has the $N^+$-type source region 24 located adjacent to the trench. Therefore, the body region 23a serves as a channel region. The floating region 23b is not coupled to the emitter electrode 28 and does not have the $N^+$-type source region 24. The floating region 23b serves as a carrier storing region for storing carriers.

As described above, the IGBT 92i has a structure in which the channel regions (i.e., body regions 23a) are spaced from each other by the carrier storing region (i.e., floating region 23b). Therefore, an IGBT like the IGBT 92i is hereinafter called "spaced-channel IGBT". According to U.S. Pat. No. 6,737,705, when the ratio of the width of the body region 23a to the width of the floating region 23b is from 1:2 to 1:7, the IGBT 92i has both a low on-voltage and a low switching loss so that total loss can be reduced.

When a spaced-channel IGBT like the IGBT 92i is applied to a semiconductor device for an inverter circuit, it is preferable that the spaced-channel IGBT and an antiparallel diode be formed in the same semiconductor substrate. In such an approach, like the semiconductor device 91 shown in FIG. 24, the semiconductor device size can be reduced. However, when the spaced-channel IGBT and an antiparallel diode are formed in the same semiconductor substrate, there may be mutual interference between the spaced-channel IGBT and the antiparallel diode.

SUMMARY OF THE INVENTION

In view of the above-described problem, it is an object of the present invention to provide a semiconductor device having a structure for reducing mutual interference between a spaced-channel IGBT and an antiparallel diode that are formed in a same semiconductor substrate.

A semiconductor device is implemented on a first conductive-type semiconductor substrate having a first side and a second side opposite to the first side. The substrate includes a transistor region and a diode region coupled in antiparallel with the transistor region. The transistor region includes a second conductive-type base layer formed to a surface portion of the first side of the substrate, a plurality of insulated gate trenches formed to the base layer, a second conductive-type first diffusion layer formed to a surface portion of the second side of the substrate, and an emitter electrode formed on the first side of the substrate. The diode region includes a first conductive-type second diffusion layer formed to the surface portion of the second side of the substrate. The second diffusion layer has a higher impurity concentration than the substrate. The diode region includes a plurality of diode cells that are repeatedly arranged and grouped together to form a diode. The transistor region includes a cell region and a boundary region located between the cell region and the diode region. In the cell region, the base layer is divided by the plurality of insulated gate trenches into a plurality of body regions and a plurality of floating regions. The body and floating regions are alternately arranged. Each body region is connected to the emitter electrode, and each floating region is not connected to the emitter electrode. The cell region includes a plurality of spaced-channel insulated-gate bipolar transistor cells that are repeatedly arranged and grouped together to form a spaced-channel insulated-gate bipolar transistor. Each transistor cell has a corresponding one of the plurality of body regions and a corresponding one of the plurality of floating regions. In the boundary region, the base layer is divided by the plurality of insulated gate trenches into a plurality of divided regions. A spacing between adjacent insulated gate trenches in the boundary region is less than a spacing between adjacent insulated gate trenches between which each floating region is located in the cell region.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 25:
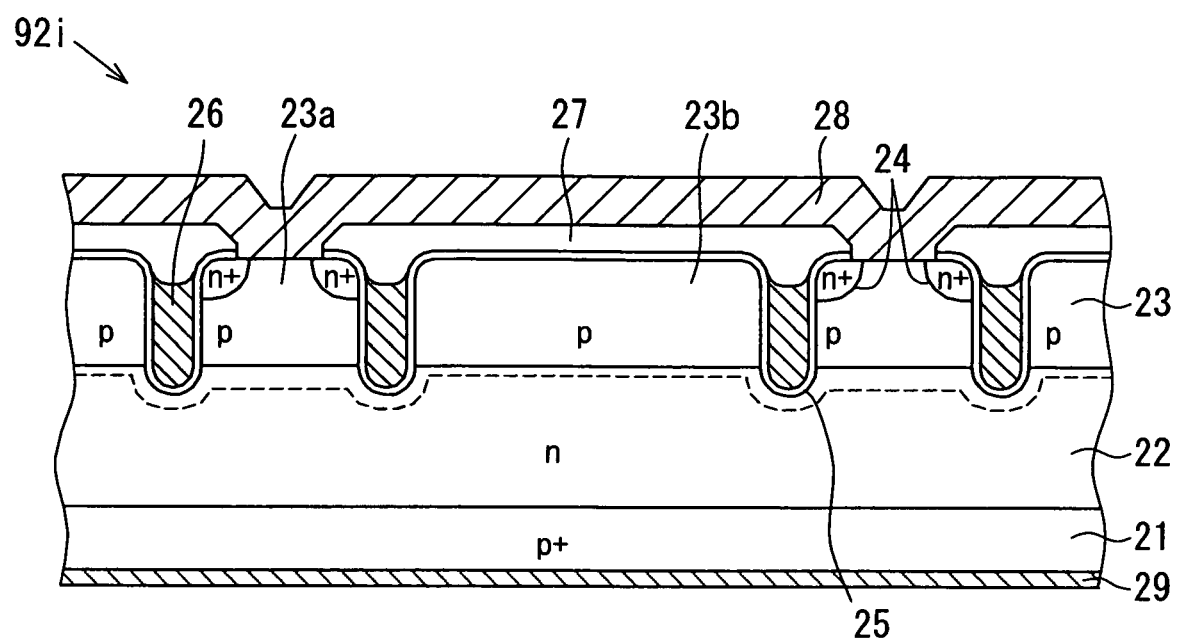
FIG. 25 is a diagram illustrating a cross-sectional view of another conventional semiconductor device.

The present invention relates to a semiconductor device including a spaced-channel insulated-gate bipolar transistor (IGBT) and an antiparallel diode, both of which are formed in a same semiconductor substrate. The spaced-channel IGBT has a floating region by which channel regions are spaced from each other. As mentioned previously with reference to FIG. 25, such a spaced-channel IGBT having a floating region can have not only low on-voltage, but also low switching loss compared to a typical IGBT having no floating region.

Figure 24:
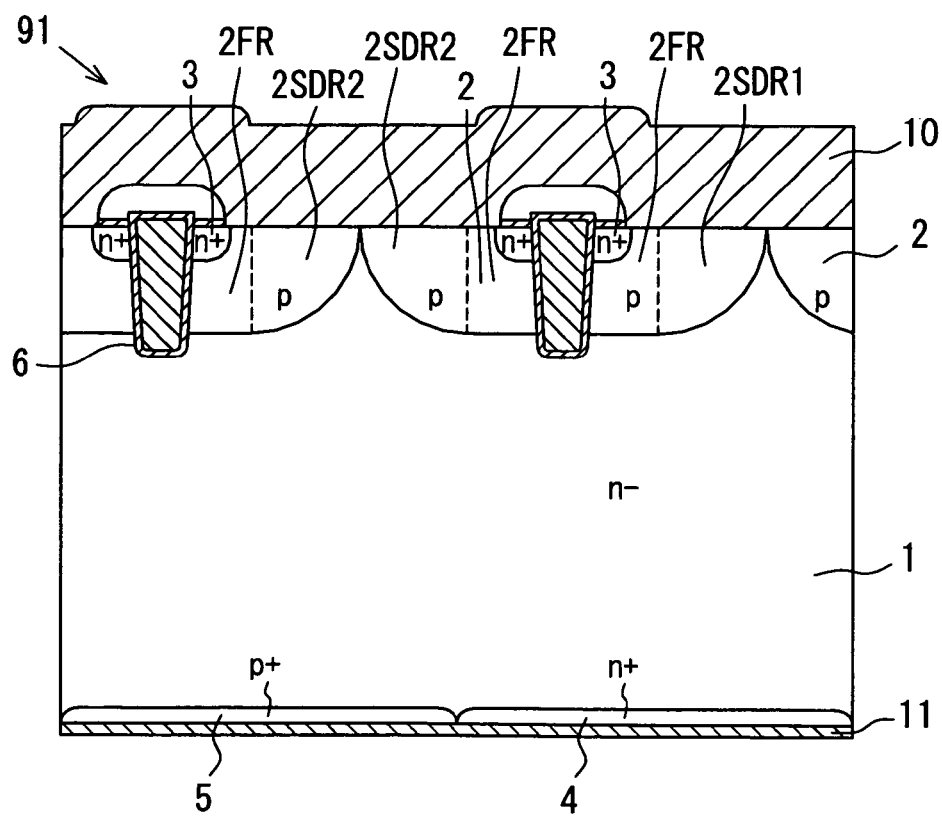
FIG. 24 is a diagram illustrating a cross-sectional view of a conventional semiconductor device.

Generally, when an IGBT and a diode coupled in antiparallel with the IGBT are formed in a same first conductive-type semiconductor substrate, a body region (i.e., channel region) coupled to an emitter electrode of the IGBT has a second conductive-type. Since an anode electrode of the diode also has the second conductive-type, the emitter electrode of the IGBT is coupled to the anode electrode of the diode. As a result, like the semiconductor device 91 shown in FIG. 24, the body region of the IGBT acts as a parasitic body diode that causes mutual interference between the IGBT and the diode.

Figure 23A:
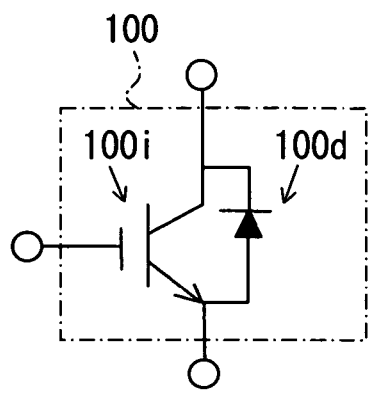
FIG. 23A is a circuit diagram illustrating a basic component of an inverter circuit.
Figure 23B:
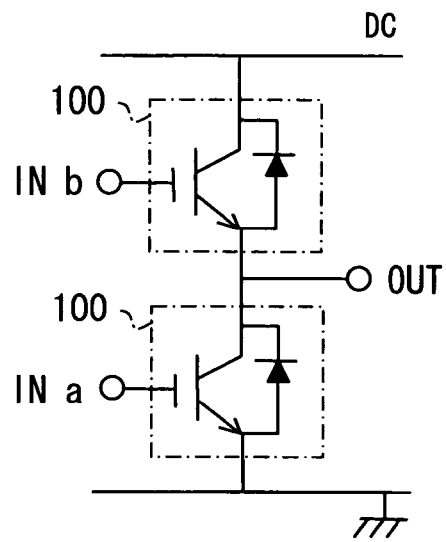
FIG. 23B is a circuit diagram illustrating a basic unit for each phase of the inverter circuit.

As mentioned previously with reference to FIG. 23A, a semiconductor device including an IGBT and an antiparallel diode are used in pairs to construct an inverter circuit. In this case, in particular, a diode reverse recovery characteristic of the mutual interference becomes a problem. Specifically, when the diode serves as a free wheel diode in the inverter circuit, a reverse overshoot current flows at a moment the diode is switched from ON to OFF.

Regarding a semiconductor device including a typical IGBT having no floating region and a diode that are formed in a same semiconductor substrate, it has been known that a reverse overshoot current is caused by the fact that carriers, which are stored during a turn-on period of the diode, flows out at a moment the diode is switched from ON to OFF.

There has been some research on such a semiconductor device including the typical IGBT having no floating region and the diode that are formed in the same semiconductor substrate. However, there has been little research on a semiconductor device including a spaced-channel IGBT having a floating region and a diode that are formed in a same semiconductor substrate. It remains to be explained how the spaced-channel IGBT and the diode interfere with each other.

Figure 1:
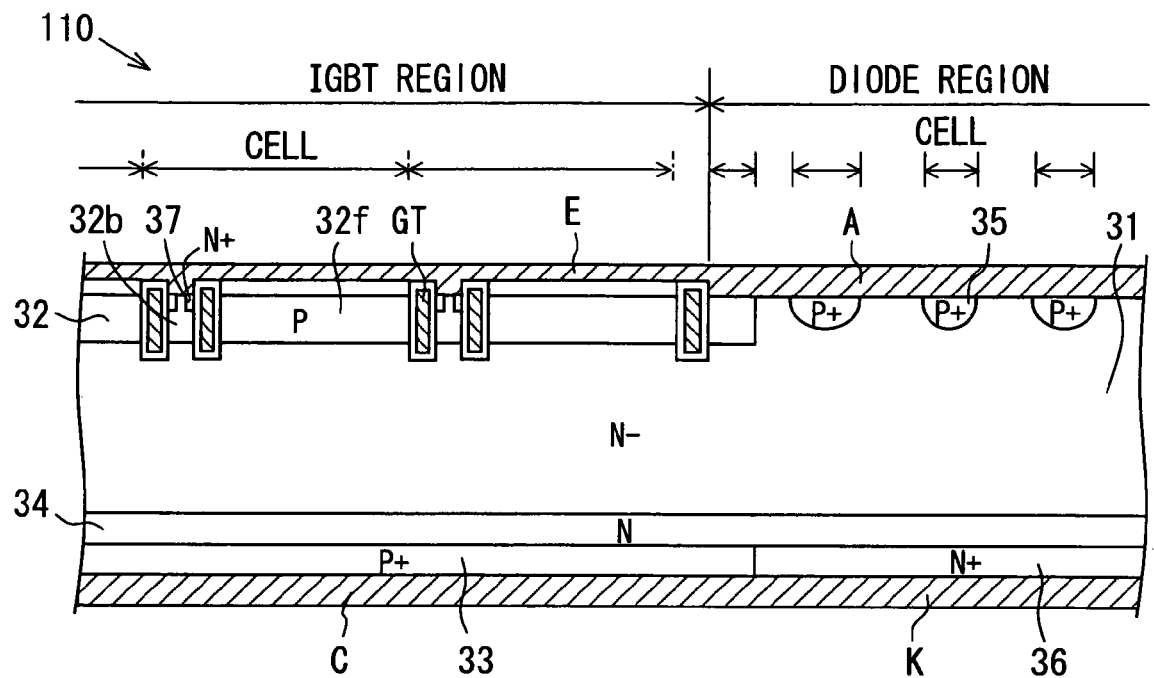
FIG. 1 is a diagram illustrating a cross-sectional view of a semiconductor device used in a first simulation.

To determine mutual interference between a spaced-channel IGBT and a diode that are formed in a same semiconductor substrate, the present inventors have conducted a simulation to evaluate characteristics of a semiconductor device 110 shown in FIG. 1. In the semiconductor device 110, a spaced-channel IGBT and a diode coupled in antiparallel with the IGBT are formed in a same N⁻-conductive-type semiconductor substrate 31. A plurality of IGBT cells is grouped together (i.e., repeatedly arranged) in a IGBT region to form the IGBT, and a plurality of diode cells is grouped together in a diode region to form the diode. As can been seen from FIG. 1, the IGBT and the diode are arranged simply adjacent to each other.

In the IGBT region, a P-conductive-type base layer 32 is formed to a surface region of a first side of the semiconductor substrate 31. The base layer 32 is divided by an insulated gate trench GT into a body region 32b and a floating region 32f. As shown in FIG. 1, whereas the body region 32b is coupled to an emitter electrode E of the IGBT, the floating region 32f is not coupled to the emitter electrode E. An N⁺-conductive-type region 37 as an emitter region of the IGBT is formed in the body region 32b and in contact with the gate trench GT. A P⁺-conductive-type first diffusion layer 33 is formed to a surface region of a second side of the semiconductor substrate 31 and located opposite to the base layer 32. The first diffusion layer 33 is coupled to a collector electrode C of the IGBT. An N-conductive-type layer 34 as a field stop layer of the IGBT is formed on the first diffusion layer 33.

In the diode region, a P⁺-conductive-type region 35 is formed to the surface region of the first side of the semiconductor substrate 31. The region 35 is coupled to an anode electrode A of the diode. An N⁺-conductive-type second diffusion layer 36 is formed to the surface region of the second side of the semiconductor substrate 31 and located opposite to the region 35. The second diffusion layer 36 has a higher impurity concentration than the semiconductor substrate 31 and coupled to a cathode electrode K of the diode.

As can been seen from FIG. 1, the emitter electrode E of the IGBT and the anode electrode A of the diode are integral with (i.e., coupled to) each other, and the collector electrode C of the IGBT and the cathode electrode K of the diode are integral with each other. Thus, the diode is coupled in antiparallel with the IGBT.

Figure 2:
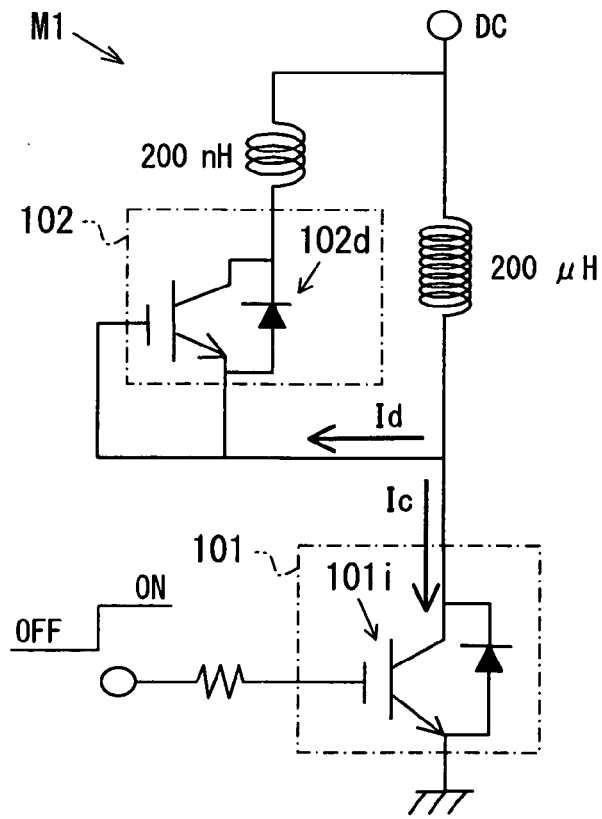
FIG. 2 is an equivalent circuit diagram illustrating a circuit model of an inverter circuit used in the first simulation.

The present inventors have conducted the simulation by applying the semiconductor device 110 shown in FIG. 1 to semiconductor devices 101, 102 of a circuit model M1 shown in FIG. 2. Gate and emitter terminals of an IGBT of the semiconductor device 102 are short-circuited together to simulate a moment when a diode 102d of the semiconductor device 102 is switched from ON to OFF (i.e., a moment when an IGBT 101i of the semiconductor device 101 is switched from OFF to ON). In the simulation, the IGBT 101i of the semiconductor device 101 serves as a switching element, and the diode 102d of the semiconductor device 102 serves as a free-wheel diode (FWD).

Figure 3:
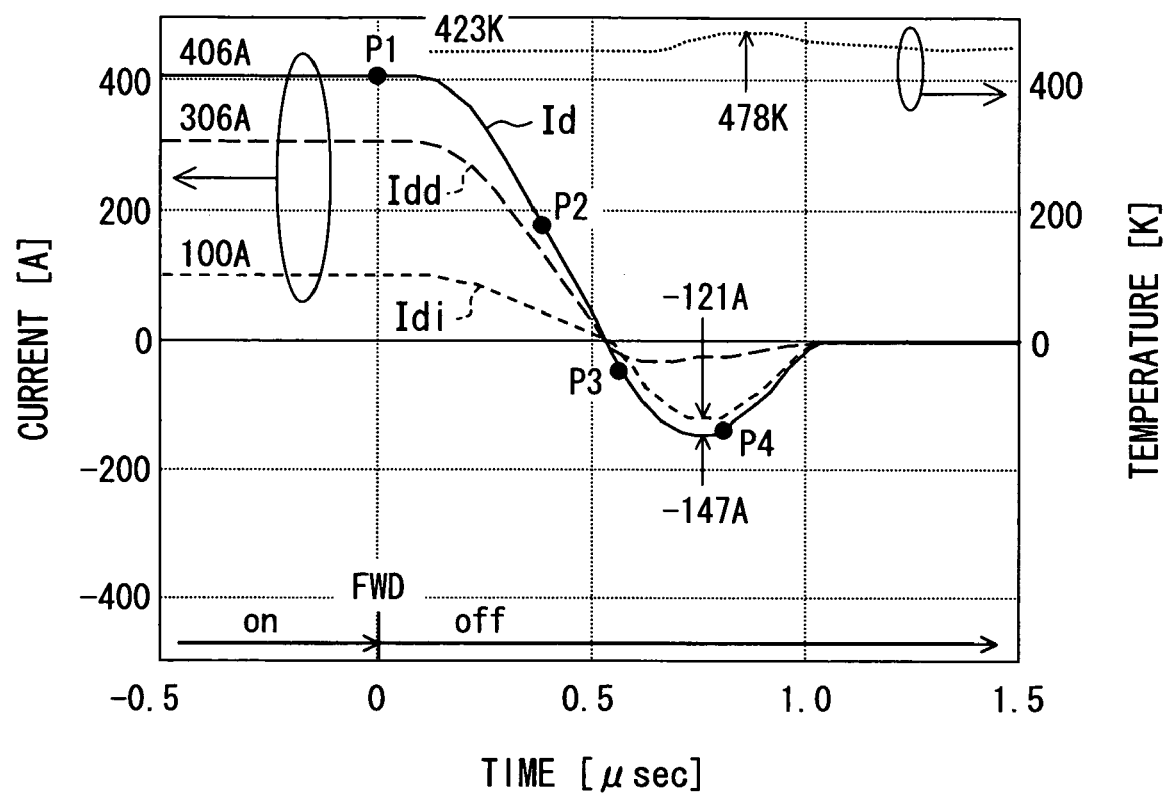
FIG. 3 is a diagram illustrating a result of the first simulation conducted by applying the semiconductor device of FIG. 1 to the circuit model of FIG. 2 and showing an electric current and a temperature of the semiconductor device of FIG. 1.

FIGS. 3-6B depict results of the simulation conducted to evaluate the characteristics of the semiconductor device 110 that is used as the semiconductor devices 101, 102 in the circuit model M1. FIG. 3 illustrates a total current Id flowing through the entire semiconductor device 110 and a temperature of the semiconductor device 110. In FIG. 3, a solid line represents the total current Id, a long dashed line represents a current Idd flowing through the diode of the semiconductor device 110, and a short dashed line represents a current Idi flowing through the IGBT of the semiconductor device 110. FIG. 4A illustrates a hole current density distribution in the semiconductor device 110 at a time P1 of FIG. 3. FIG. 4B illustrates a hole current density distribution in the semiconductor device 110 at a time P2 of FIG. 3. FIG. 5A illustrates a hole current density distribution in the semiconductor device 110 at a time P3 of FIG. 3. FIG. 5B illustrates a hole current density distribution in the semiconductor device 110 at a time P4 of FIG. 3. In FIGS. 4A, 4B, 5A and 5B, the hole current density distribution is schematically represented by using an isopycnic line and an arrow. The isopycnic line connects points where the current density is equal. The arrow has length and thickness varying with the current density.

Current concentration destroying the semiconductor device 110 results from the fact that holes stored in the N⁻-conductive-type semiconductor substrate 31 flow out from the semiconductor substrate 31 upwardly and are concentrated due to a structure of the semiconductor device 110. In view of the above, to determine a cause of the current concentration, it is important to analyze hole current density distribution rather than electron current density distribution. Therefore, as shown in FIGS. 4A-5B, the present inventors have analyzed the hole current density distribution.

Figure 4A:
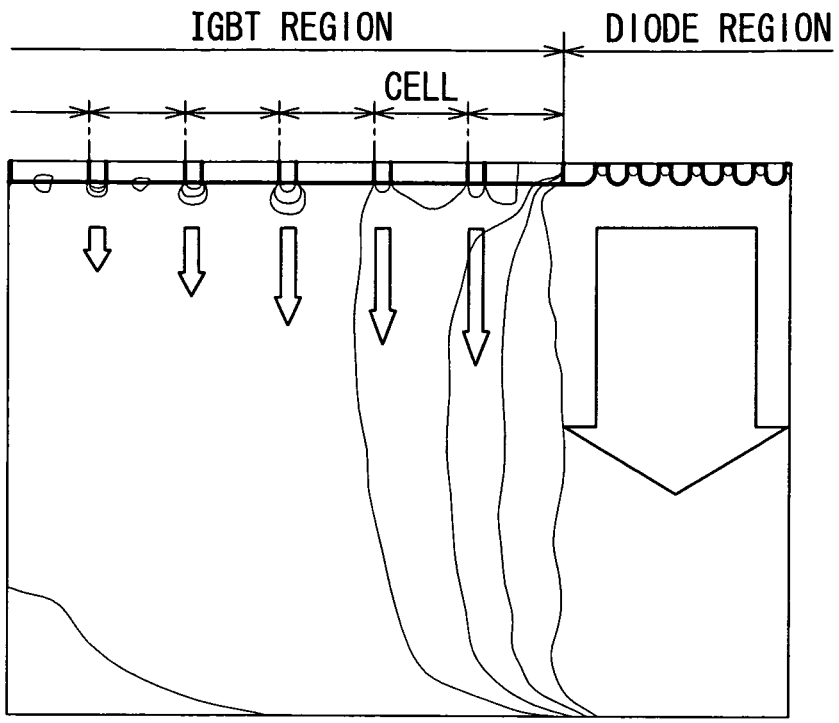
FIG. 4A is a diagram illustrating a result of the first simulation and showing a hole current density distribution in the semiconductor device of FIG. 1 at a time of P1 of FIG. 3.
Figure 4B:
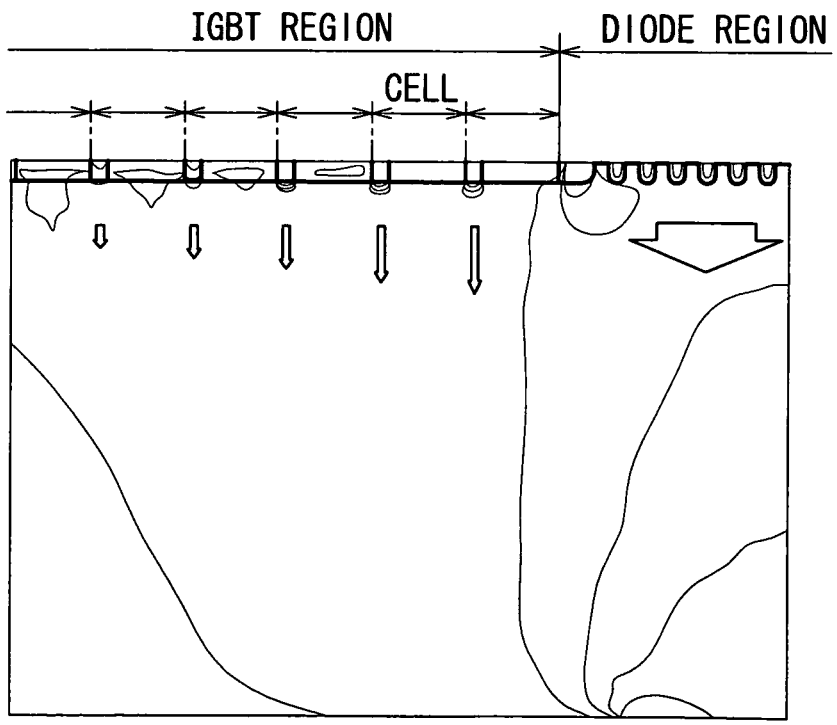
FIG. 4B is a diagram illustrating a result of the first simulation and showing a hole current density distribution in the semiconductor device of FIG. 1 at a time of P2 of FIG. 3.
Figure 5A:
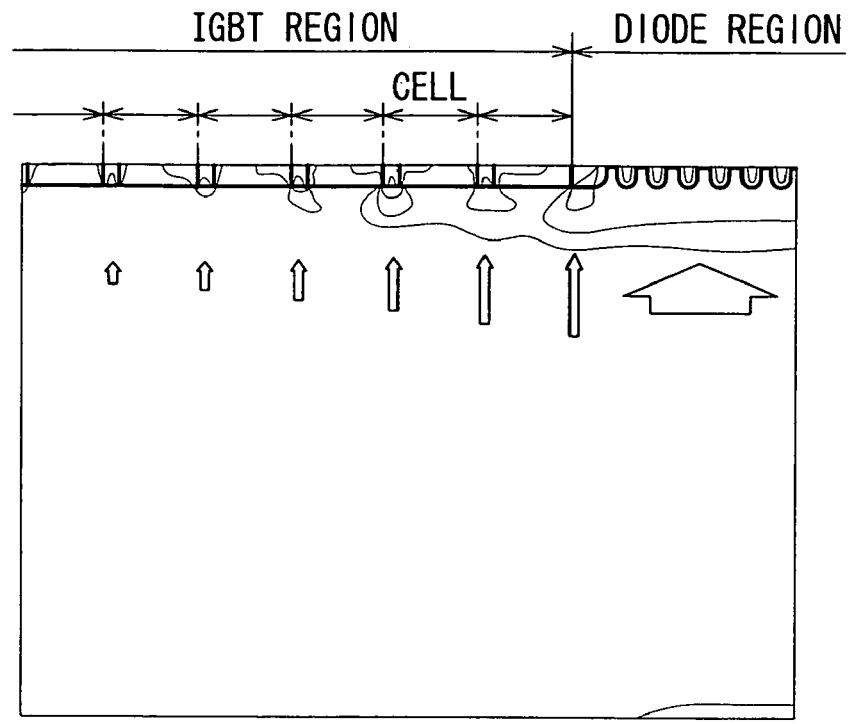
FIG. 5A is a diagram illustrating a result of the first simulation and showing a hole current density distribution in the semiconductor device of FIG. 1 at a time of P3 of FIG. 3.
Figure 5B:
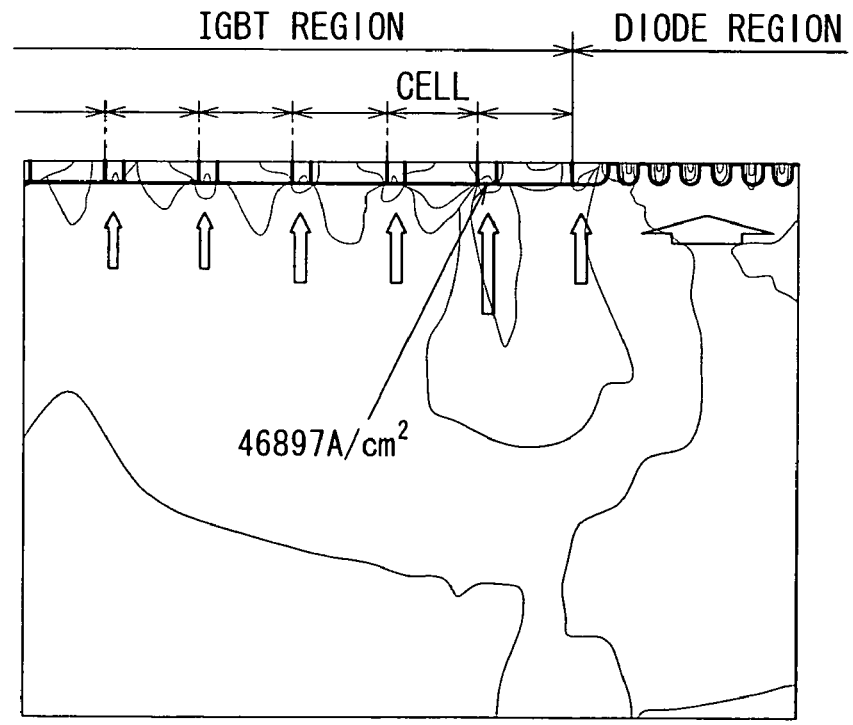
FIG. 5B is a diagram illustrating a result of the first simulation and showing a hole current density distribution in the semiconductor device of FIG. 1 at a time of P4 of FIG. 3.

In the semiconductor device 110, as shown in FIG. 3, when the diode is in ON-state, the current Idd of 306 amperes flows through the diode, and the current Idi of 100 amperes flows through the IGBT. As shown in FIG. 4A, the current Idi of 100 amperes flows through the body region 32b, which can act as a parasitic body diode. Returning to FIG. 3, when the diode is switched from ON to OFF, a reverse overshoot current Id of up to minus 147 amperes flows through the semiconductor device 110 during reverse recovery of the diode. The major part of the overshoot current Id is the current Idi of up to minus 121 amperes flowing through the IGBT. As can be seen from FIG. 5B, the nearer to the diode region, the greater the overshoot current density. For example, a maximum current density of 46897 A/cm² appears in a body diode of an IGBT cell that is located nearest to the diode region. In summary, the simulation results indicate that the current concentration occurs near the diode region.

Figure 6A:
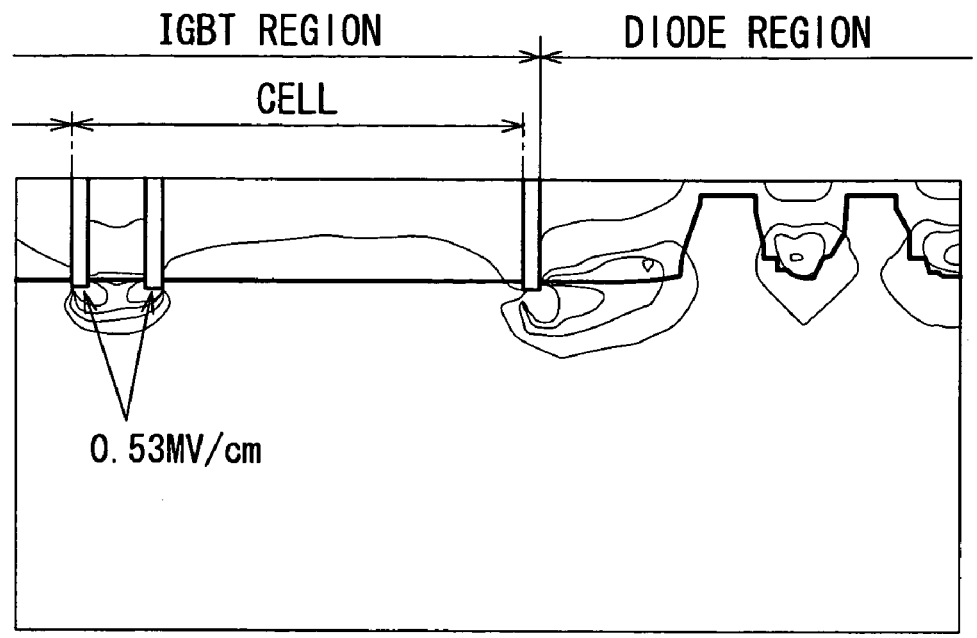
FIG. 6A is a diagram illustrating a result of the first simulation and showing an electric field intensity in the semiconductor device of FIG. 1 at the time P4 of FIG. 3.
Figure 6B:
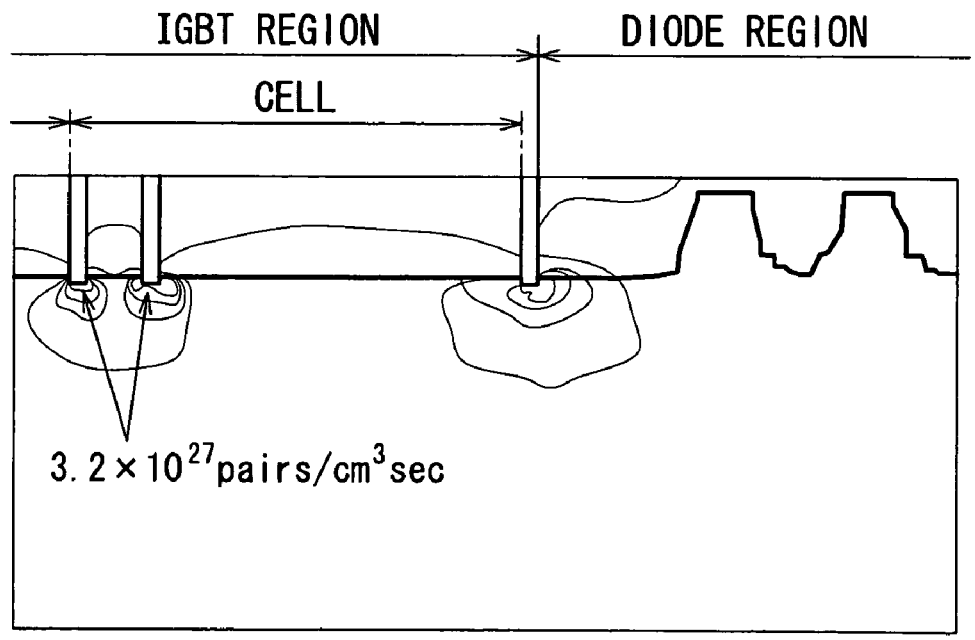
FIG. 6B is a diagram illustrating a result of the first simulation and showing a carrier generation amount distribution in the semiconductor device of FIG. 1 at the time P4 of FIG. 3.

FIG. 6A illustrates an electric field intensity near a boundary between the IGBT region and the diode region at the time P4 of FIG. 3. FIG. 6B shows distribution of the amount of carriers generated near the boundary by collision ionization at the time P4 of FIG. 3.

As shown in FIG. 6A, at the time P4, the electric field intensity below the gate trench GT of the IGBT cell located nearest to the diode region reaches up to 0.53 MV/cm. As shown in FIG. 6B, at the time P4, the amount of carriers generated below the gate trench GT of the IGBT cell located nearest to the diode region reaches up to $3.2 \times 10^{27}$ pairs/$cm^3$sec. Therefore, the simulation results indicate that the electric field is concentrated below the gate trench GT of the IGBT cell located nearest to the diode region during the diode reverse recovery. As a result, avalanche breakdown occurs at a voltage much less than a breakdown voltage of the IGBT cell, and the current concentration occurs. Consequently, the IGBT cell located nearest to the diode region can be destroyed by the current concentration.

Based on the findings obtained from the simulation results, a semiconductor device according to an embodiment of the present invention is described below.

First Embodiment

Figure 7:
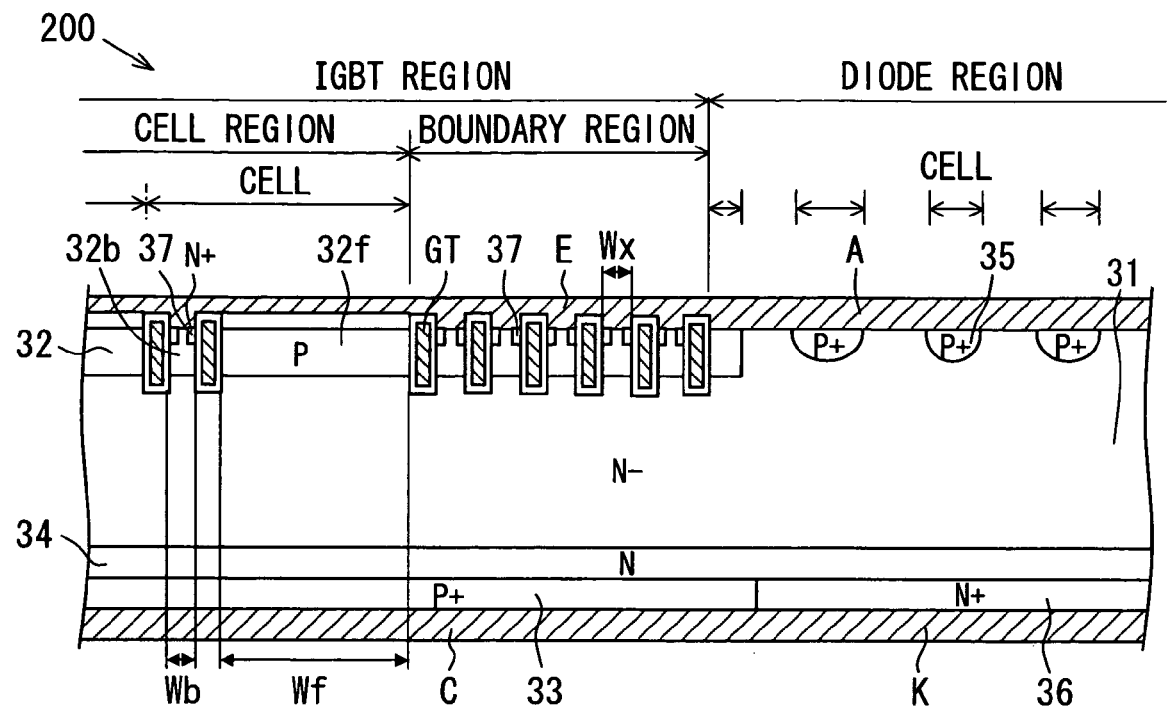
FIG. 7 is a diagram illustrating a cross-sectional view of a semiconductor device according to a first embodiment of the present invention.

FIG. 7 shows a semiconductor device 200 according to a first embodiment of the present invention.

Like the semiconductor device 110 shown in FIG. 1, the semiconductor device 200 includes a spaced-channel IGBT and a diode coupled in antiparallel with the IGBT. The IGBT and the diode are formed in a same $N^-$-conductive-type semiconductor substrate 31. A plurality of IGBT cells is grouped together (i.e., repeatedly arranged) in an IGBT region to form the IGBT, and a plurality of diode cells is grouped together in a diode region to form the diode.

A difference between the semiconductor devices 110, 200 is as follows. As shown in FIG. 7, the IGBT region of the semiconductor device 200 is sectioned into a cell region and a boundary region. The IGBT cells are grouped together in the cell region of the IGBT region. The boundary region of the IGBT region is located between the diode region and the cell region of the IGBT region. Therefore, whereas the IGBT in the semiconductor device 110 is located simply adjacent to the diode, the IGBT in the semiconductor device 200 is located away from the diode.

The insulated gate trenches GT are arranged in different patterns between in the cell region and the boundary region. In the cell region, the base layer 32 is divided by the gate trench GT into the body region 32a and the floating region 32f. Whereas the body region 32a is connected to the emitter electrode E of the IGBT, the floating region 32f is disconnected from the emitter electrode E. The $N^+$-conductive-type region 37 is formed in the body region 32b and in contact with the gate trench GT. In the boundary region, the base layer 32 is divided into regions, each of which corresponds to the body region 32a. That is, the divided region in the boundary region is connected to the emitter electrode E, and the $N^+$-conductive-type region 37 is formed in the divided region to be in contact with the gate trench GT.

As can be seen from FIG. 7, a spacing Wx between adjacent gate trenches GT in the boundary region is set less than a spacing Wf between adjacent gate trenches GT between which the floating region 32f is located in the cell region. In other words, a width of the divided region in the boundary region is set less than a width of the floating region 32f in the cell region. Further, the spacing Wx between adjacent insulated gate trenches GT in the boundary region is set equal to a spacing Wb between adjacent gate trenches GT between which the body region 32b is located in the cell region. In other words, the width of the divided region in the boundary region is set equal to a width of the body region 32b in the cell region.

The present inventors have conducted a simulation by applying the semiconductor device 200 to the semiconductor devices 101, 102 of the circuit model M1 shown in FIG. 2. FIGS. 8, 9, 10A, and 10B depict results of the simulation and correspond to FIGS. 3, 5B, 6A, and 6B, respectively.

Figure 8:
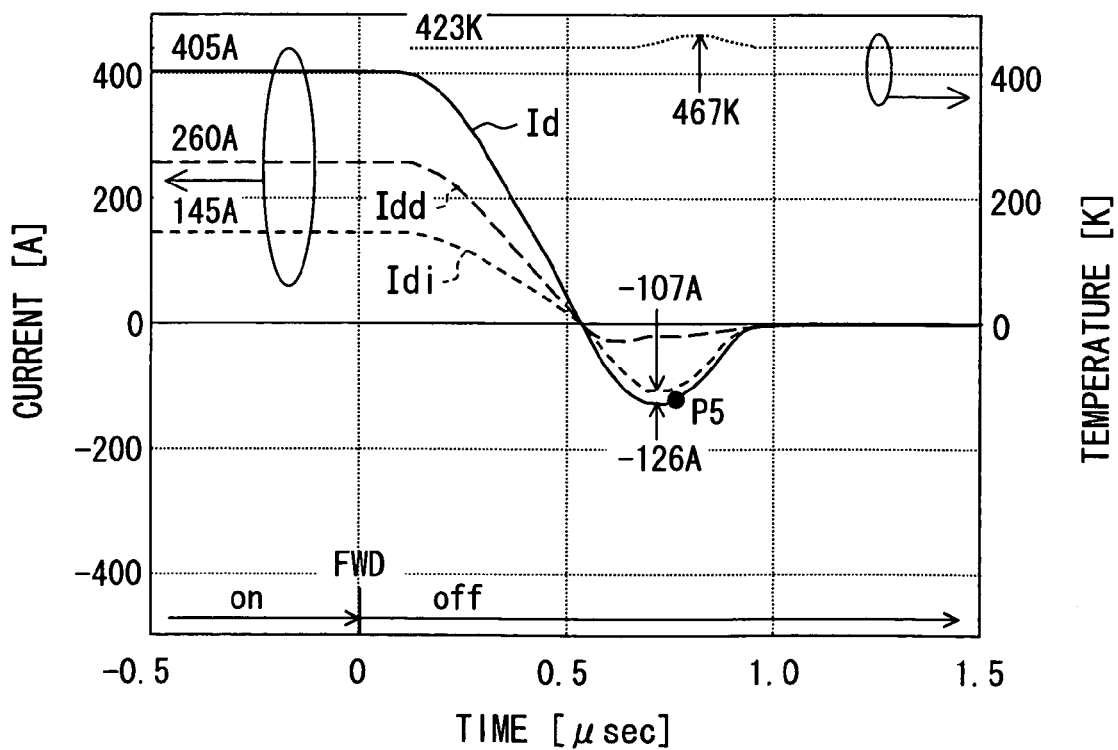
FIG. 8 is a diagram illustrating a result of a second simulation conducted by applying the semiconductor device of FIG. 7 to the circuit model of FIG. 2 and showing an electric current and a temperature of the semiconductor device of FIG. 7.

FIG. 8 illustrates a total current Id flowing through the entire semiconductor device 200 and a temperature of the semiconductor device 200. In FIG. 8, a solid line represents the total current Id, a long dashed line represents a current Idd flowing through the diode of the semiconductor device 200, and a short dashed line represents a current Idi flowing through the IGBT of the semiconductor device 200.

Figure 9:
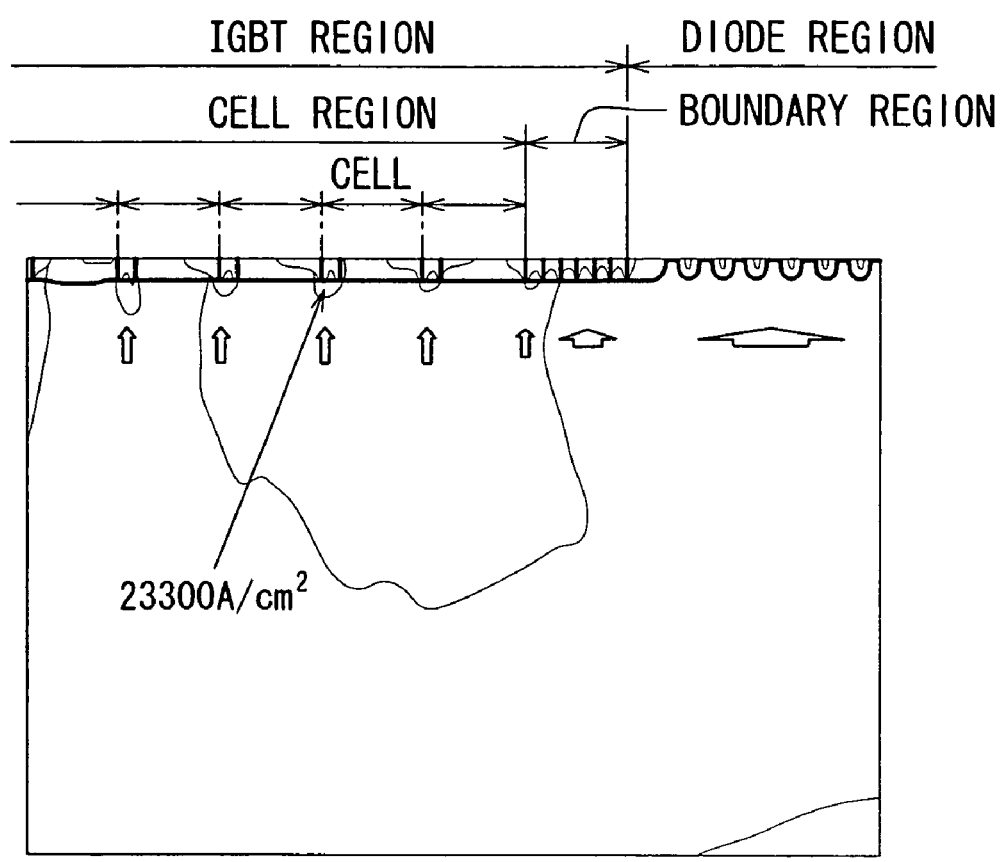
FIG. 9 is a diagram illustrating a result of the second simulation and showing a hole current density distribution in the semiconductor device of FIG. 7 at a time of P5 of FIG. 8.

FIG. 9 illustrates a hole current density distribution in the semiconductor device 200 at a time P5 of FIG. 8. In FIG. 9, the hole current density distribution is schematically represented by using an isopycnic line and an arrow. The isopycnic line connects points where the current density is equal. The arrow has length and thickness varying with the current density.

Figure 10A:
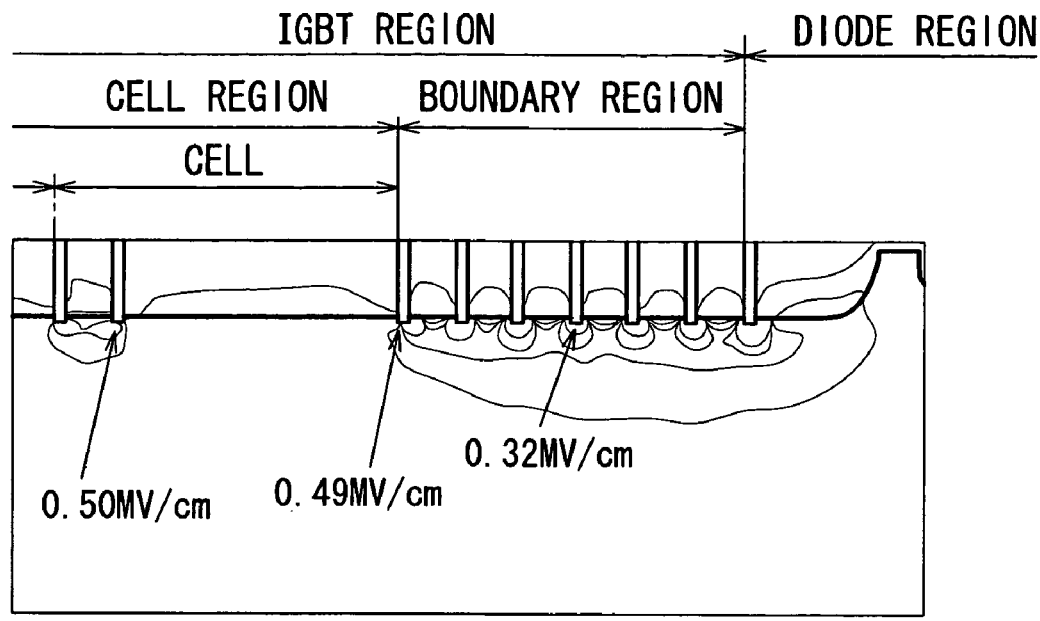
FIG. 10A is a diagram illustrating a result of the second simulation and showing an electric field intensity in the semiconductor device of FIG. 7 at the time P5 of FIG. 8.
Figure 10B:
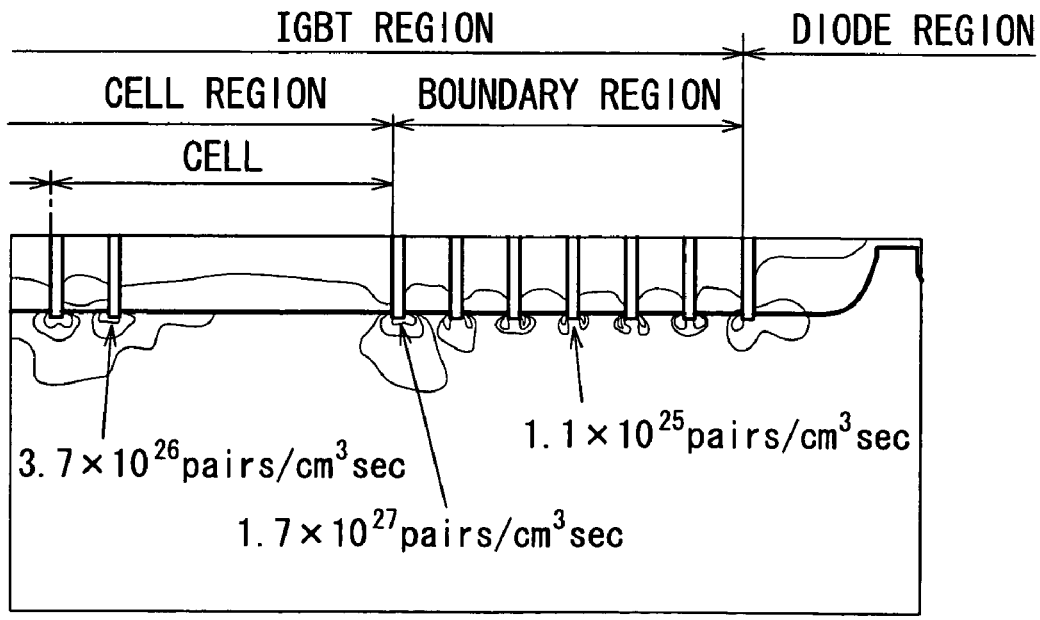
FIG. 10B is a diagram illustrating a result of the second simulation and showing a carrier generation amount distribution in the semiconductor device of FIG. 7 at the time P5 of FIG. 8.

FIG. 10A shows an electric field intensity near a boundary between the IGBT region and the diode region of the semiconductor device 200 at the time P5. FIG. 10B shows distribution of the amount of carriers generated near the boundary by collision ionization at the time P5.

The simulation results of the semiconductor device 200 are compared below with the simulation results of the semiconductor device 110. As can be seen by comparing FIGS. 3, 8, when the diode is in ON-state, the total current Id is almost the same between in the semiconductor devices 110, 200. However, the current Idd decreases from 306 amperes to 260 amperes, and the current Idi increases from 100 amperes to 145 amperes. Further, during the diode reverse recovery, the total overshoot current Id flowing through the entire semiconductor device decreases from minus 147 amperes to minus 126 amperes, and the overshoot current Idi flowing through the IGBT decreases from minus 121 amperes to minus 107 amperes.

As shown in FIG. 9, the overshoot current density distribution in the semiconductor device 200 gradually, continuously changes over the boundary region of the IGBT region. As can be seen by comparing FIGS. 5B, 9, the current concentration in the semiconductor device 200 is relieved, in particular, at an IGBT cell near the diode region. In the semiconductor device 200, a maximum current density of 23300 $A/cm^2$ appears in a body diode of the second IGBT cell counted from the boundary region. The maximum current density (23300 $A/cm^2$) of the semiconductor device 200 is reduced to about one-half of the maximum current density (46897 $A/cm^2$) of the semiconductor device 110.

The semiconductor device 200 has the boundary region, where the gate trenches GT are arranged at a narrow pitch. Therefore, as shown in FIG. 10A, an electric field intensity, which is maximized below the gate trench GT at the time P5, is kept high in the boundary region and continuously distributed over the boundary region. Accordingly, the overshoot current distribution is kept high in the boundary region and continuously distributed over the entire boundary region. As a result, the current distribution concentration in the cell region is relieved.

As described above, according to the simulation results, the current concentration at the body diode of the IGBT cell near the diode region is relieved in the semiconductor device 200 compared to in the semiconductor device 110 shown in FIG. 1. Accordingly, the reverse overshoot current is reduced in the semiconductor device 200 compared to in the semiconductor device 110. Specifically, in the semiconductor device 200, an avalanche current occurring below the gate trench GT is distributed over the boundary region, where the gate trenches GT are arranged at a pitch (i.e., Wx) narrower than the width (i.e., Wf) of the floating region 32f in the cell region. Thus, the boundary region of the IGBT region reduces mutual interference between the spaced-channel IGBT and the antiparallel diode that are formed in the semiconductor substrate 31, thereby preventing the IGBT from being destroyed during the diode reverse recovery. Therefore, the semiconductor device 200 can have a small size and high resistance to breakdown.

Figure 11:
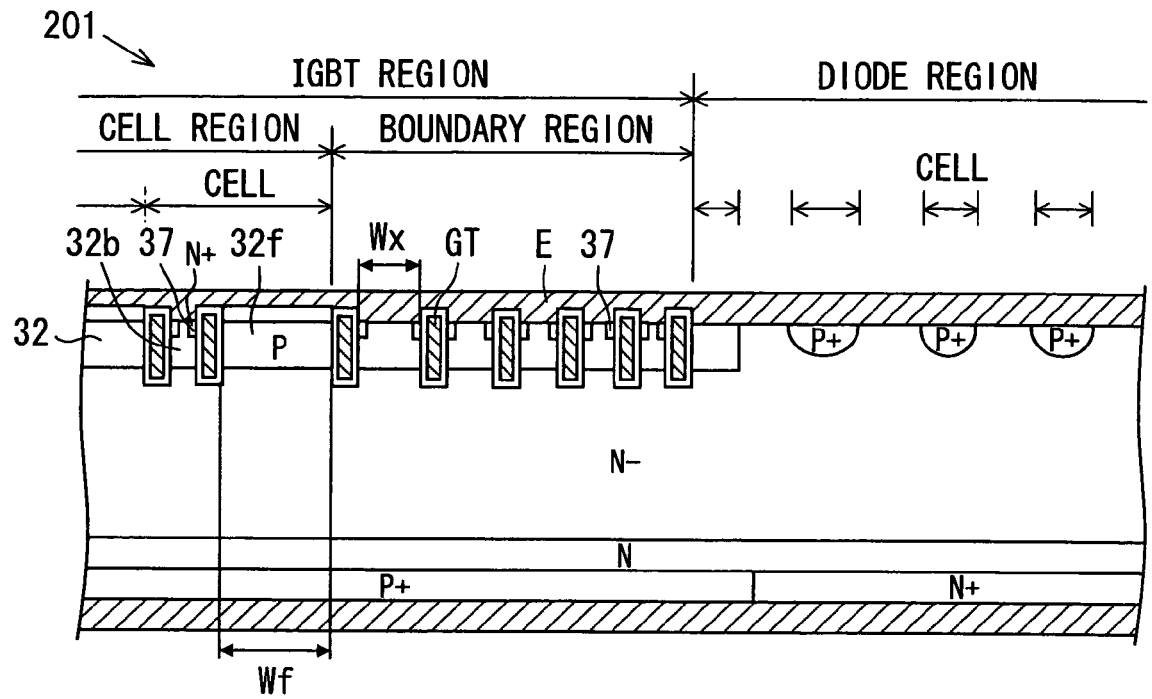
FIG. 11 is a diagram illustrating a cross-sectional view of a semiconductor device according to a modification of the semiconductor device of FIG. 7.

The semiconductor device 200 shown in FIG. 7 can be modified in various ways. For example, FIG. 11 illustrates a semiconductor device 201 according to a modification of the semiconductor device 200. A difference between the semiconductor devices 200, 201 are as follows.

As mentioned previously, in the semiconductor device 200 shown in FIG. 7, the space Wx between adjacent gate trenches GT in the boundary region is set less than the spacing Wf between adjacent gate trenches GT, between which the floating region 32f is located in the cell region. Further, the spacing Wx is set equal to the spacing Wb between adjacent gate trenches GT, between which the body region 32b is located in the cell region. In such an approach, the electric field intensity is almost equally distributed over the boundary region so that the reverse current flowing during the diode reverse recovery can be almost uniformly distributed over the boundary region. As a result, the current concentration is relieved at the body diode of the IGBT cell near the diode region.

In the semiconductor device 201 shown in FIG. 11, a space Wx between adjacent gate trenches GT in the boundary region is set less than a spacing Wf between adjacent gate trenches GT, between which the floating region 32f is located in the cell region. Whereas the space Wx in the semiconductor device 200 is regular, the space Wx in the semiconductor device 201 is irregular. Specifically, the space Wx in the semiconductor device 201 becomes continuously narrower toward the diode region.

In the semiconductor device 201, the electric field is concentrated below the gate trench GT of the boundary region. Since the space Wx becomes continuously narrower toward the diode region, the electric field in the boundary region becomes continuously weaker from the diode region toward the cell region. Accordingly, the reverse current flowing during the diode reverse recovery changes continuously in the boundary region and is distributed over the boundary region. As a result, the current concentration is relieved at the body diode of the IGBT cell near the diode region.

Figure 12:
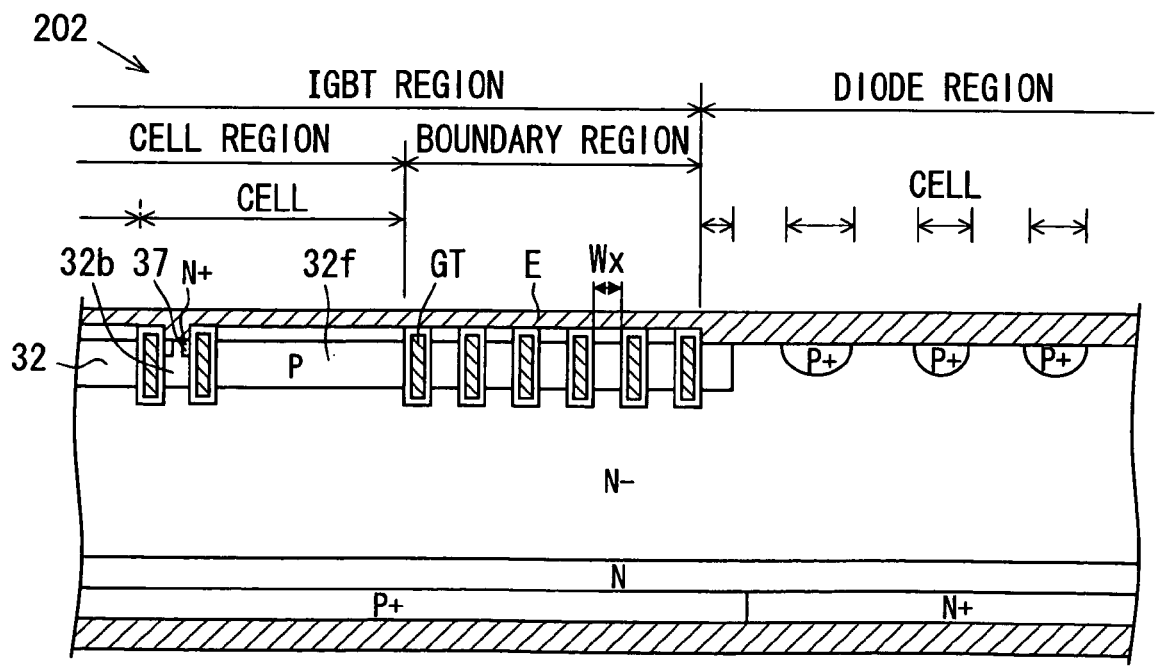
FIG. 12 is a diagram illustrating a cross-sectional view of a semiconductor device according to another modification of the semiconductor device of FIG. 7.

FIG. 12 illustrates a semiconductor device 202 according to another modification of the semiconductor device 200. A difference between the semiconductor devices 200, 202 is as follows.

In the semiconductor device 200 shown in FIG. 7, each region of the base layer 32 divided by the gate trench GT in the boundary region is coupled to the emitter electrode E, and the $N^+$-conductive-type region 37 is formed in each divided region and in contact with the gate trench GT. That is, each divided region of the base layer 32 in the boundary region corresponds to the body region 32b of the base layer 32 in the cell region. Therefore, it can be considered that the boundary region is constructed with only the body region 32b.

Figure 17:
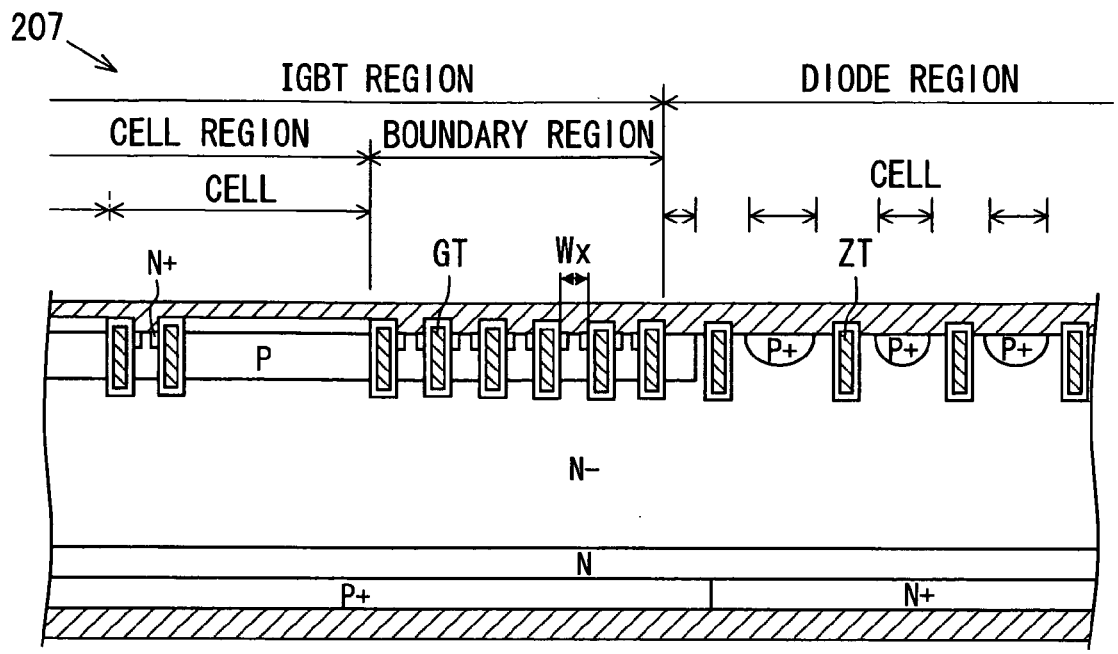
FIG. 17 is a diagram illustrating a cross-sectional view of a semiconductor device according to a second embodiment of the present invention.

In contrast, in the semiconductor device 202 shown in FIG. 17, any divided region of the base layer 32 in the boundary region is not coupled to the emitter electrode E, and the $N^+$-conductive-type region 37 is not formed in any divided region. That is, each divided region of the base layer 32 in the boundary region corresponds to the floating region 32f of the base layer 32 in the cell region. Therefore, it can be considered that the boundary region is constructed with only the floating region 32f.

Figure 13:
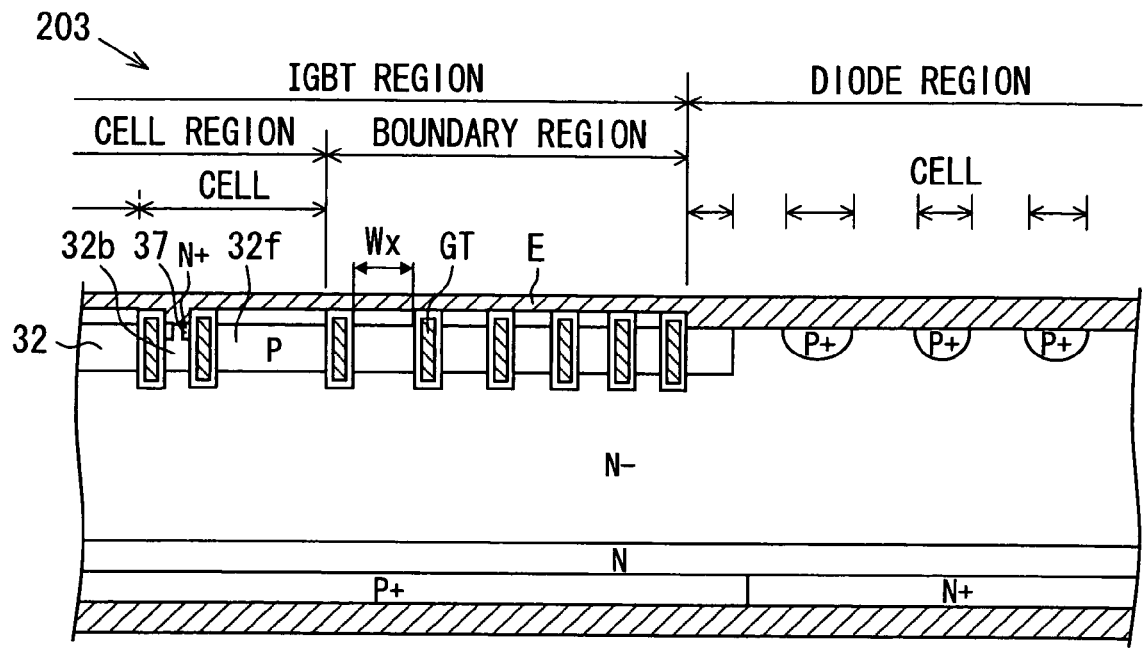
FIG. 13 is a diagram illustrating a cross-sectional view of a semiconductor device according to a modification of the semiconductor device of FIG. 11.

FIG. 13 illustrates a semiconductor device 203 according to a modification of the semiconductor device 201 shown in FIG. 11. A difference between the semiconductor devices 201, 203 is the same as the difference between the semiconductor devices 200, 202. That is, whereas the boundary region of the semiconductor device 201 is constructed with only the body region 32b, the boundary region of the semiconductor device 203 is constructed with only the floating region 32f.

In the semiconductor devices 200, 201, since the boundary region is constructed with only the body region 32b, the entire boundary region contributes to an increase in a current capacity of the IGBT. Therefore, the semiconductor devices 200, 201 can be reduced in size compared to the semiconductor devices 202, 203. However, the effect of distributing the current density during the diode reverse recovery is mainly caused by the gate trenches GT that are arranged at the narrow pitch in the boundary region. Therefore, like the semiconductor devices 200, 201, the semiconductor devices 202, 203 can achieve the effect of distributing the current density during the diode reverse recovery. Thus, in the semiconductor devices 202, 203, the current concentration can be relieved at the body diode of the IGBT cell near the diode region.

Figure 14:
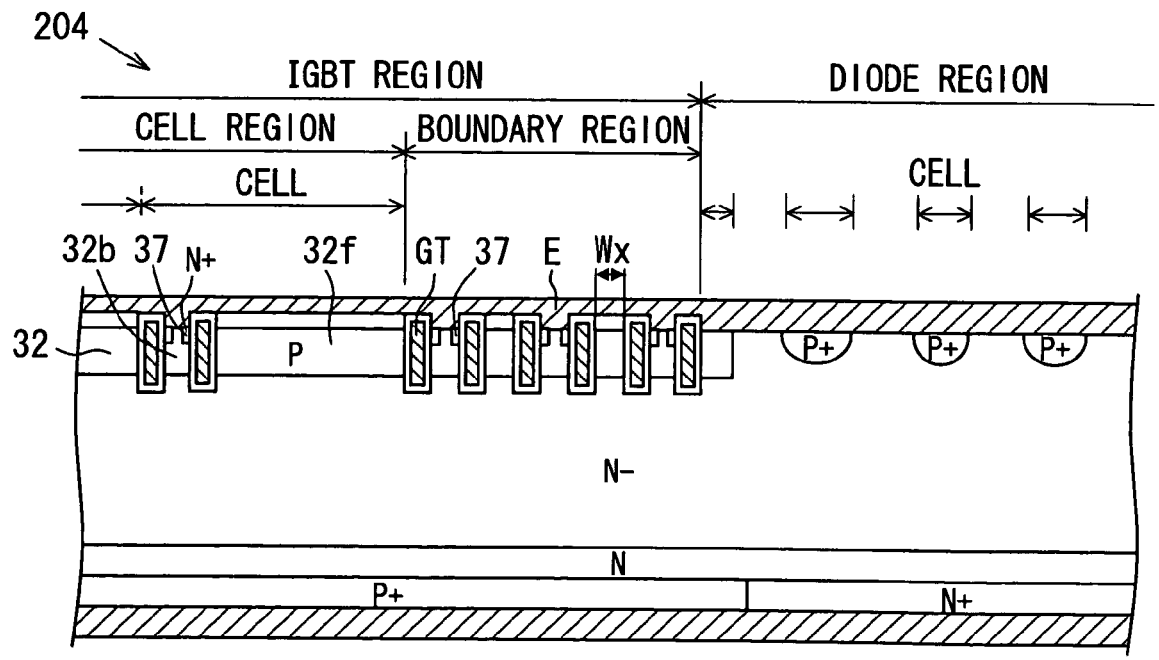
FIG. 14 is a diagram illustrating a cross-sectional view of a semiconductor device according to another modification of the semiconductor device of FIG. 7.

FIG. 14 illustrates a semiconductor device 204 according to another modification of the semiconductor device 200 shown in FIG. 7. A difference between the semiconductor devices 200, 204 is as follows. The boundary region of the semiconductor device 200 is constructed with only the body region 32b. In contrast, the boundary region of the semiconductor device 204 is constructed with the body region 32b and the floating region 32f that are alternately arranged. The space Wx between adjacent gate trenches GT in the boundary region is set equal to the spacing Wb between adjacent gate trenches GT, between which the body region 32b is located in the cell region. That is, in the semiconductor device 204, both the cell region and the boundary region have an alternating structure of the body region 32b and the floating region 32f. Like the semiconductor device 200, the semiconductor device 204 achieves the effect of distributing the current density over the boundary region during the diode reverse recovery, thereby relieving the current concentration at the body diode of the IGBT cell near the diode region.

Figure 15:
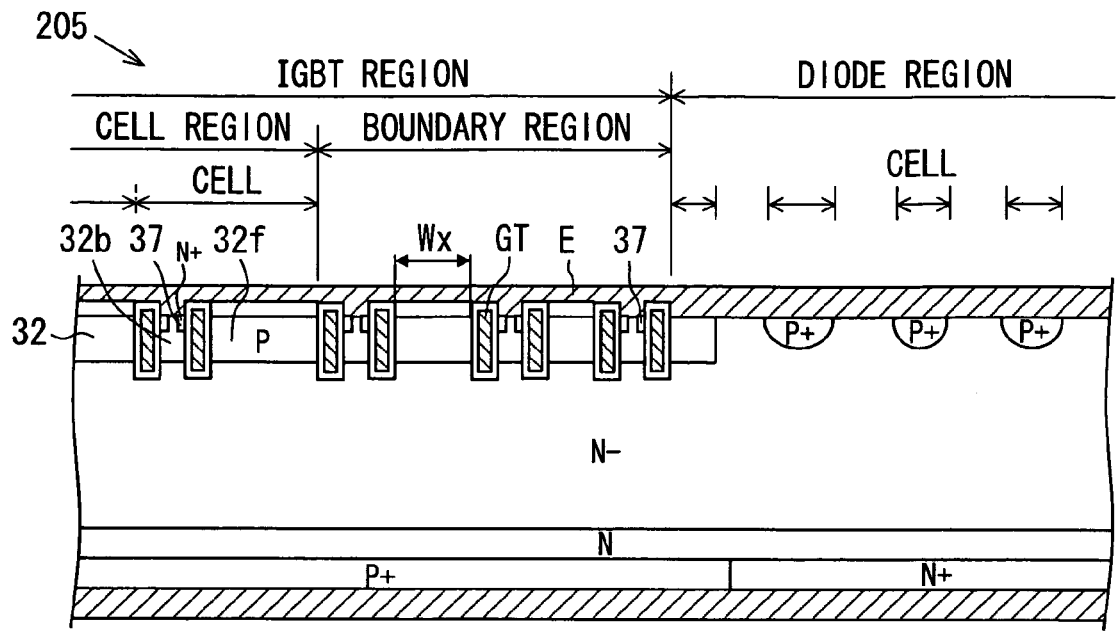
FIG. 15 is a diagram illustrating a cross-sectional view of a semiconductor device according to a modification of the semiconductor device of FIG. 14.

FIG. 15 illustrates a semiconductor device 205 according to a modification of the semiconductor device 204 shown in FIG. 14. A difference between the semiconductor devices 204, 205 is as follows. In the semiconductor device 204, the spacing Wx between adjacent gate trenches GT in the boundary region is regular. In contrast, in the semiconductor device 205, the spacing Wx between adjacent gate trenches GT, between which the floating region 32f is located in the boundary region, is irregular. Specifically, the space Wx in the boundary region becomes continuously narrower toward the diode region. Therefore, the electric field in the boundary region becomes continuously weaker from the diode region toward the cell region. Accordingly, the reverse current flowing during the diode reverse recovery changes continuously in the boundary region and is distributed over the boundary region. As a result, the current concentration is relieved at the body diode of the IGBT cell near the diode region.

Figure 16:
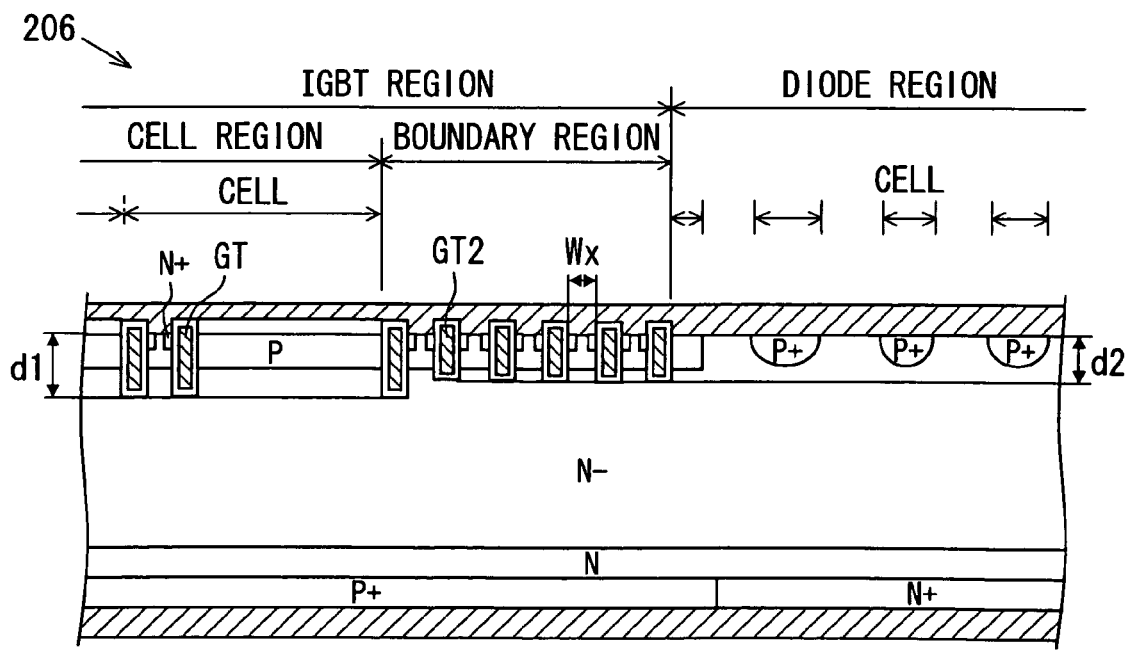
FIG. 16 is a diagram illustrating a cross-sectional view of a semiconductor device according to another modification of the semiconductor device of FIG. 7.

FIG. 16 illustrates a semiconductor device 206 according to another modification of the semiconductor device 200 shown in FIG. 7. A difference between the semiconductor devices 200, 206 is as follows.

In the semiconductor device 200, the depth of the gate trench GT in the cell region is set equal to the depth of the gate trench GT in the boundary region. In such an approach, manufacturing process of the semiconductor device 200 is simplified so that manufacturing cost of the semiconductor device 200 can be reduced.

In contrast, in the semiconductor device 206, a depth d1 of an insulated gate trench GT1 in the cell region is set greater than a depth d2 of an insulated gate trench GT2 in the boundary region. In such an approach, the electric field intensity in the boundary region can be reduced in the semiconductor device 206 compared to in the semiconductor device 200. Accordingly, the current density in the boundary region during the diode reverse recovery can be reduced in the semiconductor device 206 compared to in the semiconductor device 200. As a result, the current concentration can be relieved in the semiconductor device 206 compared to in the semiconductor device 200.

The structure of the semiconductor device 206 can be applied to the semiconductor devices 201-205 so that the semiconductor devices 201-205 can have the same effect as the semiconductor device 206. That is, the gate trench GT of the semiconductor devices 201-205 can have a greater depth in the cell region than in the boundary region.

Second Embodiment

A semiconductor device 207 according to a second embodiment of the present invention is described below with reference to FIG. 17. A difference between the semiconductor devices 200, 207 is as follows.

In the semiconductor device 207, an insulated trench ZT is formed in the diode region. The insulated trench ZT has a same depth and cross-sectional structure as the insulated gate trench GT formed in the IGBT region. Therefore, the electric field is concentrated below the insulated trench ZT so that the electric field intensity in the diode region is increased in the semiconductor device 207 compared to in the semiconductor device 200. As a result, the reverse current in the diode region during the diode reverse recovery is increased in the semiconductor device 207 compared to in the semiconductor device 200. Accordingly, the reverse current in the IGBT region is reduced in the semiconductor device 207 compared to in the semiconductor device 200. Thus, the reverse current is distributed over the entire semiconductor device 207 so that the current concentration in the IGBT region can be relieved in the semiconductor device 207 compared to in the semiconductor device 200.

It is preferable that the insulated trench ZT be repeatedly arranged at a regular pitch as shown in FIG. 17. In such an approach, the electric field intensity in the diode region is almost equally distributed so that the reverse current in the diode region can be almost uniformly distributed. As a result, the current concentration in the diode region can be relieved.

The structure of the semiconductor device 207 can be applied to the semiconductor devices 201-206 so that the semiconductor devices 201-206 can have the same effect as the semiconductor device 207. That is, the insulated trench can be formed in the diode region of the semiconductor devices 201-206.

A semiconductor device 208 according to a third embodiment of the present invention is described below with reference to FIG. 18. A difference between the semiconductor devices 200, 208 is as follows. In the semiconductor device 208, the base layer 32 extends from the IGBT region into the diode region, and an insulated gate trench GT3 is formed in the diode region. The gate trench GT3 has a same depth and cross-section as the gate trench GT formed in the IGBT region. The base layer 32 in the diode region can be used as an anode region of the diode. Therefore, the special anode region 35 of the semiconductor device 200 can be eliminated from the semiconductor device 208 so that the semiconductor device 208 can be manufactured at low cost compared to the semiconductor device 200.

Further, in the semiconductor device 208, the cell region of the IGBT region and the diode region have a same alternating structure of the body region 32b and the floating region 32f on the first side of the semiconductor substrate 31. In such an approach, design and manufacturing process of the semiconductor device 208 are simplified so that manufacturing cost of the semiconductor device 208 can be reduced.

Figure 18:
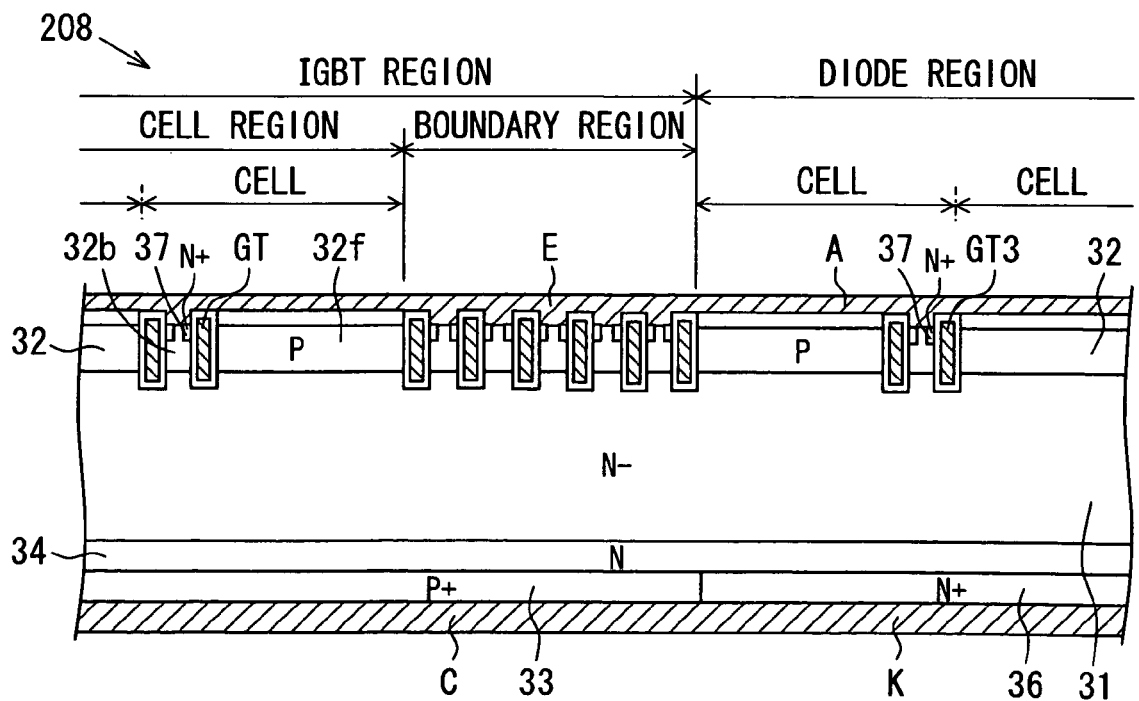
FIG. 18 is a diagram illustrating a cross-sectional view of a semiconductor device according to a third embodiment of the present invention.
Figure 19:
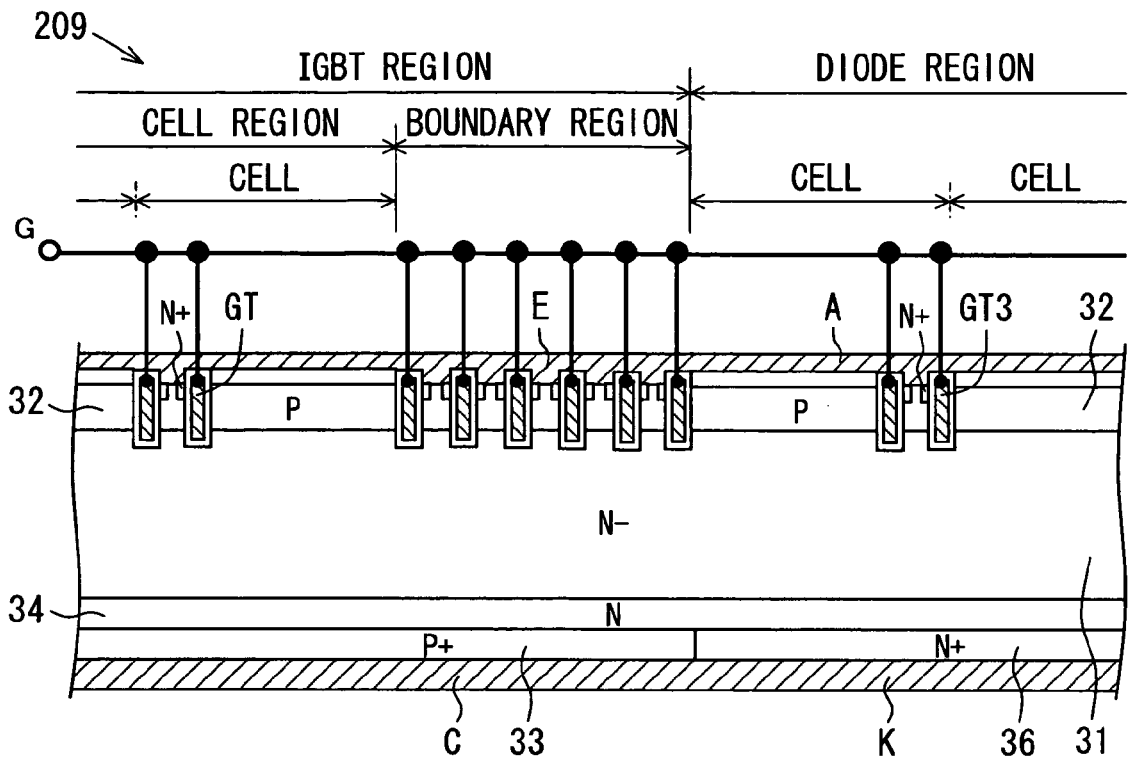
FIG. 19 is a diagram illustrating a cross-sectional view of a semiconductor device according to a practical example of the semiconductor device of FIG. 18.

FIG. 19 illustrates a semiconductor device 209 according to a practical example of the semiconductor device 208 shown in FIG. 18. In the semiconductor device 209, the gate trench GT3 formed in the diode region is coupled in parallel with the gate trench GT formed in the IGBT region. In such an approach, a structural portion of the diode region on the first side of the semiconductor substrate 31 can serve as part of the IGBT. Therefore, the structural portion can contribute to an increase in a current capacity of the IGBT.

Figure 20:
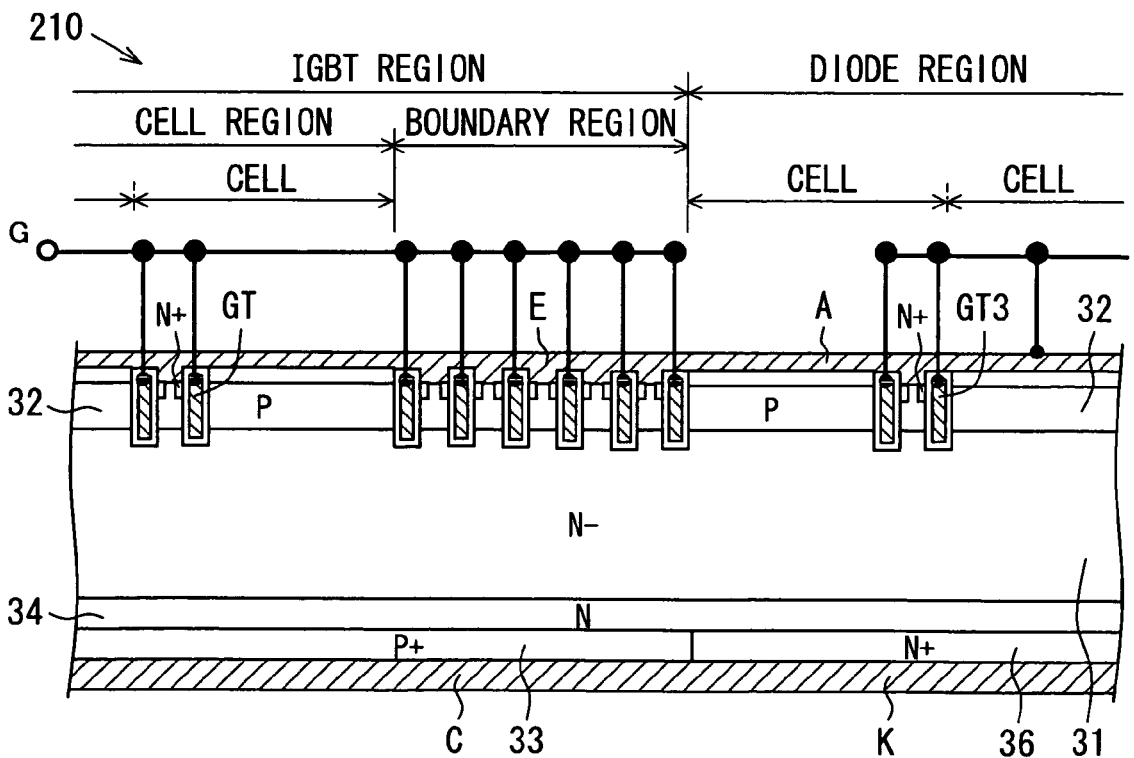
FIG. 20 is a diagram illustrating a cross-sectional view of a semiconductor device according to another practical example of the semiconductor device of FIG. 18.

FIG. 20 illustrates a semiconductor device 210 according to another practical example of the semiconductor device 208. In the semiconductor device 210, the gate trench GT3 formed in the diode region is short-circuited to the emitter electrode E to prevent the structural portion of the diode region from serving as the IGBT. Therefore, the structural portion can be specialized to serve as the diode so that design of the diode can be simplified.

Figure 21:
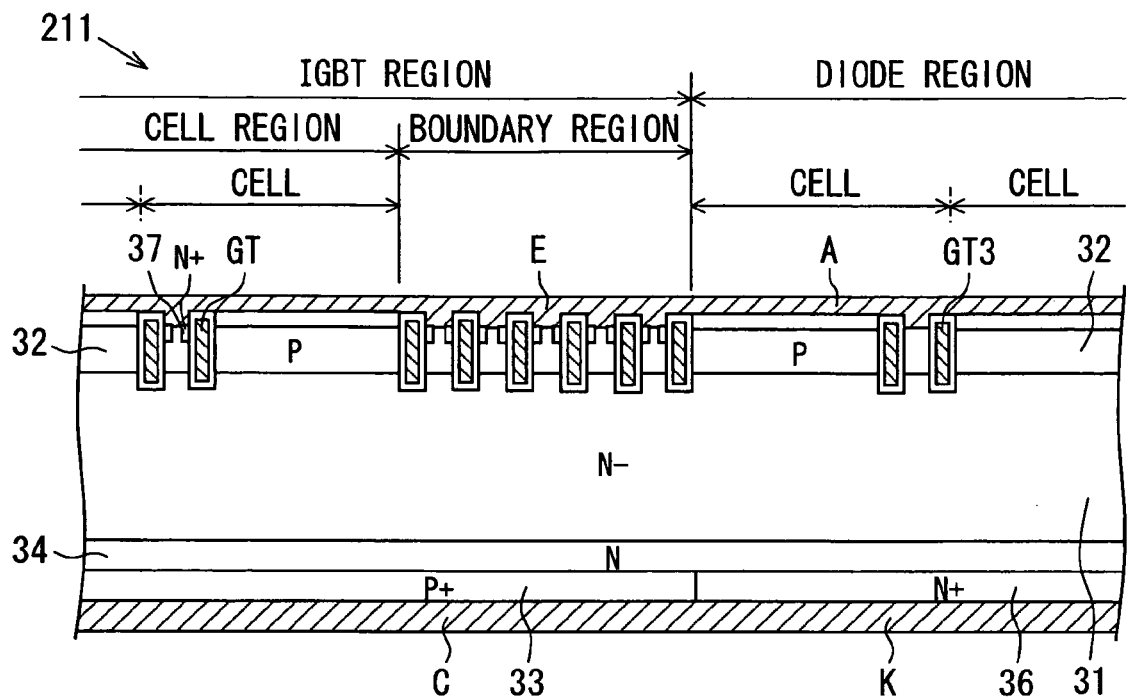
FIG. 21 is a diagram illustrating a cross-sectional view of a semiconductor device according to a modification of the semiconductor device of FIG. 18.

FIG. 21 illustrates a semiconductor device 211 according to a modification of the semiconductor device 210. Like the semiconductor device 210, the semiconductor device 211 has a diode region specialized to serve as the diode. Therefore, the design of the diode can be simplified. A difference between the semiconductor devices 210, 211 is that the $N^+$-conductive-type region 37 is not formed in the diode region of the semiconductor device 211. Since the cell region and the diode region have the same alternating structure of the body region 32b (except the $N^+$-conductive-type region 37) and the floating region 32f on the first side of the semiconductor substrate 31, the gate electrodes GT, GT3 can be wired using the same wiring pattern. Therefore, the design of the diode can be more simplified.

Figure 22:
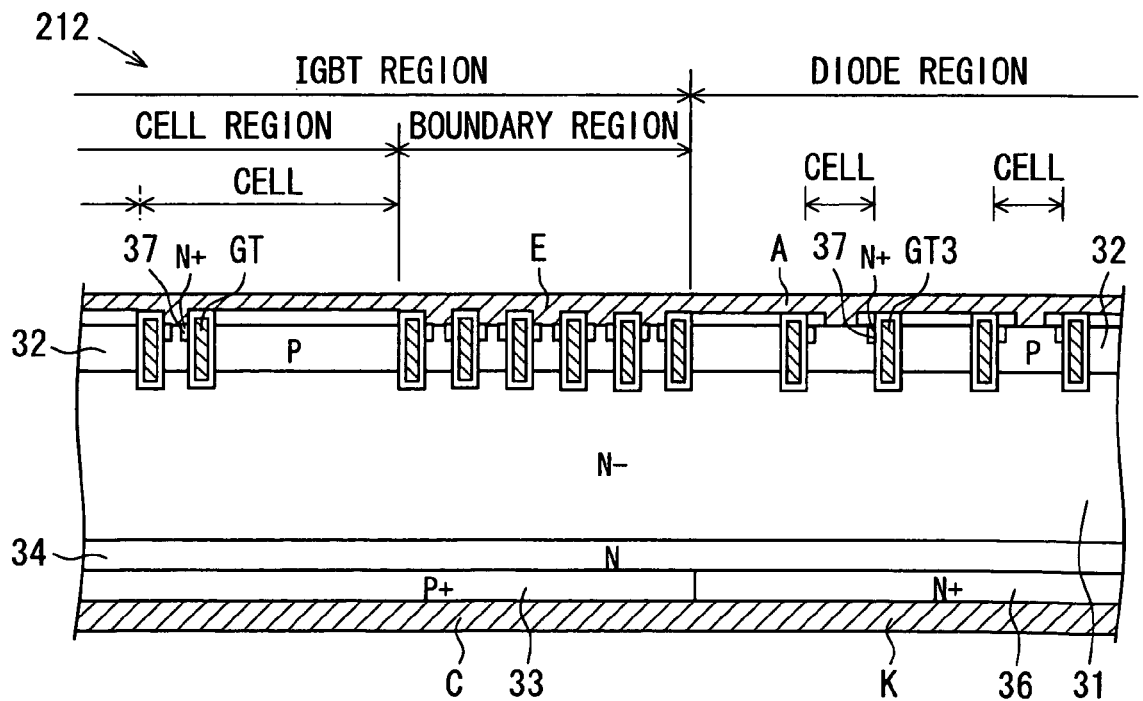
FIG. 22 is a diagram illustrating a cross-sectional view of a semiconductor device according to another modification of the semiconductor device of FIG. 18.

FIG. 22 illustrates a semiconductor device 212 according to another modification of the semiconductor device 210. Like the semiconductor device 210, the semiconductor device 211 has a diode region specialized to serve as the diode. Therefore, the design of the diode can be simplified. A difference between the semiconductor devices 210, 212 is that the $N^+$-conductive-type region 37 formed in the diode region of the semiconductor device 211 is not coupled to the emitter electrode E.

In the semiconductor devices 208-211 respectively shown in FIGS. 18-21, the cell region and the diode region have the same alternating structure of the body region 32b and the floating region 32f on the first side of the semiconductor substrate 31. Alternatively, like the semiconductor device 212 shown in FIG. 22, the cell region and the diode region can have different structures on the first side of the semiconductor substrate 31.

The IGBT cell region of the semiconductor devices 207-212 respectively shown in FIGS. 17-22 has the same structure as that of the semiconductor device 200 shown in FIG. 7.

Therefore, like the semiconductor device 200, the semiconductor devices 207-212 can be manufactured at low cost, reduced in size, and have high resistance to breakdown.

As described above, according to the semiconductor devices 200-212 of the embodiments of the present inventions, the boundary region of the IGBT region reduces mutual interference between the spaced-channel IGBT and the antiparallel diode that are formed in the same semiconductor substrate 31, thereby preventing the IGBT from being destroyed during the diode reverse recovery. Thus, the semiconductor devices 200-212 can be manufactured at low cost, reduced in size, and have high resistance to breakdown.

Therefore, the semiconductor devices 200-212 can be suitably used for an inverter circuit. For example, a vehicle is equipped with an inverter circuit having high voltage and high current capacity to supply electric power to apparatus (e.g., a motor) using a DC power source. In particular, the semiconductor devices 200-212 can be suitably used for such an inverter circuit mounted on a vehicle.

MODIFICATIONS

The embodiments described above may be modified in various ways. For example, the structure of the diode region of the semiconductor devices 207-212 respectively shown in FIGS. 17-22 can be applied to the diode region of the semiconductor devices 201-206 respectively shown in FIGS. 11-16. In such an approach, the semiconductor devices 201-206 can have the same effect as the semiconductor devices 207-212.

Such changes and modifications are to be understood as being within the scope of the present invention as defined by the appended claims.

What is claimed is:

1. A semiconductor device comprising:
a first conductive-type semiconductor substrate having a first side and a second side opposite to the first side;
a transistor region including a second conductive-type base layer formed to a surface portion of the first side of the substrate, a plurality of insulated gate trenches formed to the base layer, a second conductive-type first diffusion layer formed to a surface portion of the second side of the substrate, and an emitter electrode formed on the first side of the substrate; and
a diode region coupled in antiparallel with the transistor region and including a first conductive-type second diffusion layer formed to the surface portion of the second side of the substrate, the second diffusion layer having a higher impurity concentration than the substrate;
wherein the diode region includes a plurality of diode cells that are repeatedly arranged and grouped together to form a diode,
wherein the transistor region includes a cell region and a boundary region located between the cell region and the diode region,
wherein in the cell region, the base layer is divided by the plurality of insulated gate trenches into a plurality of body regions and a plurality of floating regions, the body and floating regions being alternately arranged, each body region being connected to the emitter electrode, each floating region being disconnected from the emitter electrode,
wherein the cell region includes a plurality of spaced-channel insulated-gate bipolar transistor cells that are repeatedly arranged and grouped together to form a spaced-channel insulated-gate bipolar transistor, each transistor cell having a corresponding one of the plurality of body regions and a corresponding one of the plurality of floating regions,
wherein in the boundary region, the base layer is divided by the plurality of insulated gate trenches into a plurality of divided regions, and
wherein a first spacing between adjacent insulated gate trenches in the boundary region is less than a second spacing between adjacent insulated gate trenches between which each floating region is located in the cell region.

2. The semiconductor device according to claim 1,
wherein the first spacing is equal to a third spacing between adjacent insulated gate trenches between which each body region is located in the cell region.

3. The semiconductor device according to claim 1,
wherein the first spacing becomes narrower toward the diode region.

4. The semiconductor device according to claim 1,
wherein each of the plurality of divided regions in the boundary region is connected to the emitter electrode.

5. The semiconductor device according to claim 1,
wherein the plurality of divided regions in the boundary region includes a plurality of first divided regions and a plurality of second divided regions, the first and second divided regions being alternately arranged, each first divided region being connected to the emitter electrode, each second divided region being disconnected from the emitter electrode, and
wherein the first spacing between adjacent insulated gate trenches between which each second divided region is located in the boundary region becomes narrower toward the diode region.

6. The semiconductor device according to claim 1,
wherein a depth of each insulated gate trench in the boundary region is equal to a depth of each insulated gate trench in the cell region.

7. The semiconductor device according to claim 1,
wherein a depth of each insulated gate trench in the boundary region is less than a depth of each insulated gate trench in the cell region.

8. The semiconductor device according to claim 1,
wherein the diode region includes at least one insulated trench having a same depth and cross-sectional structure as each insulate gate trench in the cell region.

9. The semiconductor device according to claim 8,
wherein at least one insulated trench comprise a plurality of insulated trenches that are repeatedly arranged.

10. The semiconductor device according to claim 1,
wherein the base layer extends from the transistor region into the diode region, and
wherein the diode region includes a plurality of insulated gate trenches, each having a same depth and cross-sectional structure as each insulate gate trench in the cell region.

11. The semiconductor device according to claim 10,
wherein the diode region has a same cross-sectional structure as the cell region on the first side of the semiconductor substrate.

12. The semiconductor device according to claim 10,
wherein the plurality of insulated gate trenches in the diode region is coupled in parallel with the plurality of insulated gate trenches in the transistor region.

13. The semiconductor device according to claim 10,
wherein the plurality of insulated gate trenches in the diode region is short-circuited to the emitter electrode of the transistor region.

14. The semiconductor device according to claim 10,
wherein the transistor region includes a plurality of first conductive-type emitter regions, each emitter region being formed in the corresponding body region, and
wherein the diode region has a same cross-sectional structure as the cell region on the first side of the semiconductor substrate except the plurality of first conductive-type emitter regions.

15. The semiconductor device according to claim 10,
wherein the diode region includes a first conductive-type emitter region, the emitter region being formed in the base layer and located adjacent to at least one of the plurality of insulated gate trenches in the diode region, and
wherein the base layer is connected to the emitter electrode such that the emitter region is disconnected from the emitter electrode.

16. The semiconductor device according to claim 1,
wherein the semiconductor device is used in an inverter circuit.

17. The semiconductor device according to claim 1,
wherein the semiconductor device is used in apparatus mounted on a vehicle.

* * * * *